(12) United States Patent
Li et al.

(10) Patent No.: US 11,870,024 B2
(45) Date of Patent: Jan. 9, 2024

(54) DISPLAY DEVICE AND METHOD FOR MANUFACTURING THE DISPLAY DEVICE HAVING A BRIDGE PATTERN PROVIDED IN A PERIPHERAL AREA

(71) Applicant: SAMSUNG DISPLAY CO., LTD., Yongin-si (KR)

(72) Inventors: Xinxing Li, Yongin-si (KR); Dae Hyun Kim, Yongin-si (KR); Myeong Hee Kim, Yongin-si (KR); Veidhes Basrur, Yongin-si (KR); Je Won Yoo, Yongin-si (KR); Bek Hyun Lim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 507 days.

(21) Appl. No.: 17/266,387

(22) PCT Filed: Feb. 7, 2019

(86) PCT No.: PCT/KR2019/001543
§ 371 (c)(1),
(2) Date: Feb. 5, 2021

(87) PCT Pub. No.: WO2020/032335
PCT Pub. Date: Feb. 13, 2020

(65) Prior Publication Data
US 2021/0296550 A1 Sep. 23, 2021

(30) Foreign Application Priority Data
Aug. 7, 2018 (KR) .................. 10-2018-0091890

(51) Int. Cl.
*G09G 3/32* (2016.01)
*H01L 33/62* (2010.01)
(Continued)

(52) U.S. Cl.
CPC .............. *H01L 33/62* (2013.01); *G09G 3/32* (2013.01); *H01L 27/156* (2013.01);
(Continued)

(58) Field of Classification Search
CPC ... H01L 27/156; H01L 33/005; H01L 33/382; H01L 33/62; H01L 2933/0016; H01L 2933/0066; G09G 3/32
(Continued)

(56) References Cited

U.S. PATENT DOCUMENTS 8,258,692 B2   9/2012  Hong et al.
8,872,214 B2  10/2014  Negishi et al.
(Continued)

FOREIGN PATENT DOCUMENTS

JP   4814394   11/2011
JP   4914929    4/2012
(Continued)

OTHER PUBLICATIONS

Indian Examination Report for Indian Patent Application or Patent No. 202117008017, dated Mar. 10, 2022.
(Continued)

*Primary Examiner* — Hoai V Pham
(74) *Attorney, Agent, or Firm* — KILE PARK REED & HOUTTEMAN PLLC

(57) ABSTRACT

A display device may include a substrate including a display area and a non-display area; and pixels provided in the display area, each of the plurality of pixels comprising sub-pixels. Each of the plurality of sub-pixels may include a pixel circuit layer including at least one transistor, and a display element layer including an emission area and a peripheral area, a first electrode provided in the emission area, a second electrode spaced apart from the first electrode, at least one light emitting element provided in the emission
(Continued)

area, and including a first end electrically connected to the first electrode, and a second end electrically connected to the second electrode; a first connection line provided in the peripheral area; and a bridge pattern provided in the peripheral area, and diverging from the first connection line. The bridge pattern may be electrically disconnected from each of the first and second electrodes.

20 Claims, 24 Drawing Sheets

(51) Int. Cl.
*H01L 27/15* (2006.01)
*H01L 33/00* (2010.01)
*H01L 33/38* (2010.01)

(52) U.S. Cl.
CPC .......... *H01L 33/005* (2013.01); *H01L 33/382* (2013.01); *H01L 2933/0016* (2013.01); *H01L 2933/0066* (2013.01)

(58) Field of Classification Search
USPC .................................................... 257/59, 72
See application file for complete search history.

(56) References Cited

U.S. PATENT DOCUMENTS

| | | | |
|---|---|---|---|
| 9,076,748 B2 | 7/2015 | Kim | |
| 9,214,499 B2 | 12/2015 | Jeung et al. | |
| 9,229,236 B2 | 1/2016 | Hino et al. | |
| 9,287,242 B2 | 3/2016 | Shibata et al. | |
| 9,570,425 B2 | 2/2017 | Do | |
| 9,773,761 B2 | 9/2017 | Do | |
| 9,935,241 B2 | 4/2018 | Do et al. | |
| 10,062,804 B2 | 8/2018 | Do et al. | |
| 10,461,123 B2 | 10/2019 | Kim et al. | |
| 10,672,946 B2 | 6/2020 | Cho et al. | |
| 2011/0089850 A1 | 4/2011 | Shibata et al. | |
| 2013/0027623 A1 | 1/2013 | Negishi et al. | |
| 2018/0047799 A1 | 2/2018 | Lim et al. | |
| 2018/0175106 A1 | 6/2018 | Kim et al. | |
| 2019/0019930 A1 | 1/2019 | Do et al. | |
| 2019/0035980 A1 | 1/2019 | Do et al. | |
| 2019/0363153 A1* | 11/2019 | Matsui | H05B 33/10 |

FOREIGN PATENT DOCUMENTS

| | | |
|---|---|---|
| KR | 10-0932989 | 12/2009 |
| KR | 10-2013-0080412 | 7/2013 |
| KR | 10-2014-0085331 | 7/2014 |
| KR | 10-1436123 | 11/2014 |
| KR | 10-1490758 | 2/2015 |
| KR | 10-2015-0045333 | 4/2015 |
| KR | 10-2016-0079409 | 7/2016 |
| KR | 10-1730929 | 4/2017 |
| KR | 10-1730977 | 4/2017 |
| KR | 10-1770632 | 8/2017 |
| KR | 10-2017-0101334 | 9/2017 |
| KR | 10-2018-0007376 | 1/2018 |
| KR | 10-1814104 | 1/2018 |
| KR | 10-2018-0072909 | 7/2018 |
| TW | I621259 | 4/2018 |

OTHER PUBLICATIONS

International Search Report corresponding to International Application No. PCT/KR2019/001543 dated May 17, 2019.
Written Opinion, with English translation, corresponding to International Application No. PCT/KR2019/001543, dated May 17, 2019.
Notice of Allowance with English translation for Korean Patent Application No. 10-2018-0091890, dated May 30, 2023.

* cited by examiner

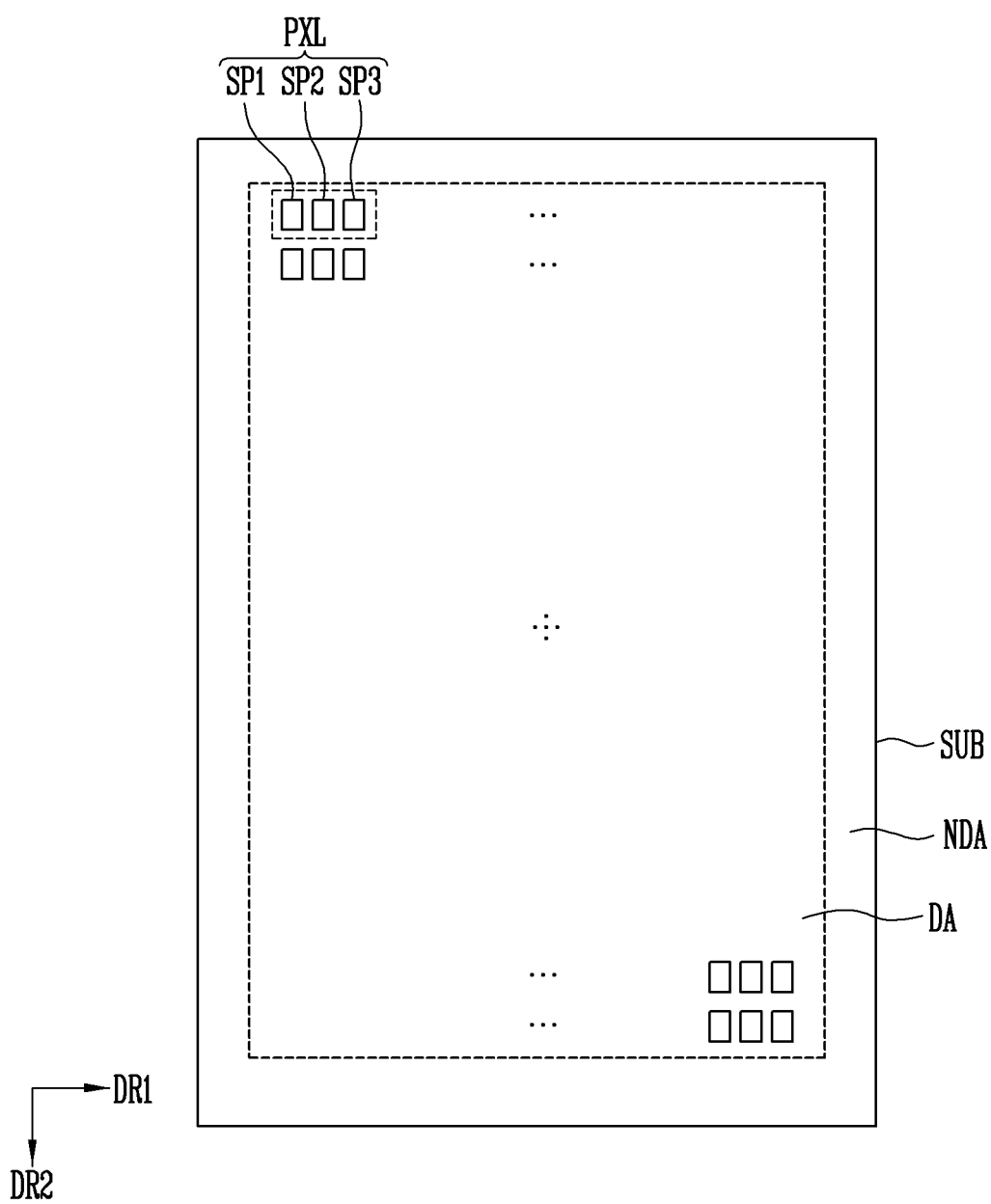

DISPLAY DEVICE AND METHOD FOR MANUFACTURING THE DISPLAY DEVICE HAVING A BRIDGE PATTERN PROVIDED IN A PERIPHERAL AREA

CROSS REFERENCE TO RELATED APPLICATION(S)

This application is a national entry of International Application No. PCT/KR2019/001543, filed on Feb. 7, 2019, which claims under 35 U.S.C. §§ 119(a) and 365(b) priority to and benefits of Korean Patent Application No. 10-2018-0091890, filed on Aug. 7, 2018 in the Korean Intellectual Property Office (KIPO), the entire contents of all of which are incorporated herein by reference.

BACKGROUND

1. Technical Field

The disclosure relates to a display device and a method of fabricating the display device.

2. Description of the Related Art

A light emitting diode may have relatively satisfactory durability even under poor environmental conditions and have excellent performances in terms of lifetime and luminance. Recently, research on the technology of applying such light emitting diodes to various display devices has become appreciably more active.

As a part of such research, technologies of fabricating a light emitting diode having a subminiature size, e.g., the microscale or nanoscale size, using an inorganic crystalline structure, e.g., a structure obtained by growing a nitride-based semiconductor are being developed. For example, subminiature diodes may be fabricated in a small size enough to form a pixel of a self-emissive display device, etc.

Various embodiments of the disclosure are directed to a display device and a method of manufacturing (or fabricating) the display device, in which each sub-pixel including at least one subminiature light emitting element may be independently driven.

According to an aspect of the disclosure, a display device may include: a substrate including a display area and a non-display area; and a plurality of pixels provided in the display area of the substrate, each of the plurality of pixels comprising a plurality of sub-pixels. Each of the plurality of sub-pixels may include a pixel circuit layer including at least one transistor; and a display element layer including an emission area through which light is emitted; a peripheral area provided around the emission area; a first electrode provided in the emission area; a second electrode spaced apart from the first electrode; at least one light emitting element provided in the emission area and including a first end electrically connected to the first electrode; and a second end electrically connected to the second electrode; a first connection line provided in the peripheral area, and extending in a direction; and a bridge pattern provided in the peripheral area, and diverging from the first connection line in another direction intersecting the direction. The bridge pattern may be electrically disconnected from each of the first and the second electrodes.

In an embodiment of the disclosure, the first connection line may include: a 1-1-th connection line, the 1-1-th connection line and the first electrode being disposed on a same layer; and a 1-2-th connection line disposed on the 1-1-th connection line. The bridge pattern may be integral with the 1-2-th connection line.

In an embodiment of the disclosure, in a plan view, the bridge pattern may have a shape protruding from the 1-2-th connection line toward the emission area.

In an embodiment of the disclosure, the display element layer may further include: a first capping layer disposed on the first electrode and overlapping the first electrode; and a second capping layer provided on the second electrode and overlapping the second electrode. The first capping layer and the 1-2-th connection line are disposed on a same layer.

In an embodiment of the disclosure, the bridge pattern may be spaced apart from the first capping layer.

In an embodiment of the disclosure, the display element layer may further include a second connection line extending parallel to an extension direction of the first connection line in the peripheral area and electrically connected with the second electrode. The second connection line may include a 2-1-th connection line, the 2-1-th connection line and the 1-1-th connection line being disposed on a same layer; and a 2-2-th connection line disposed on the 2-1-th connection line.

In an embodiment of the disclosure, the bridge pattern, the first and the second capping layers, the 1-2-th connection line, and the 2-2-th connection line may be disposed on a same layer and may include an identical material.

In an embodiment of the disclosure, the pixel circuit layer may include: a driving voltage line disposed on the substrate and transmitting a driving voltage; and a passivation layer disposed on the at least one transistor and the driving voltage line, and including a first contact hole exposing a portion of the at least one transistor; and a second contact hole exposing a portion of the driving voltage line. The first contact hole may be provided in the emission area such that the first contact hole corresponds to a portion of the first electrode.

In an embodiment of the disclosure, the first electrode may be electrically connected to the at least one transistor through the first contact hole, and the second electrode may be electrically connected to the driving voltage line through the second contact hole.

In an embodiment of the disclosure, the first electrode may include a 1-1-th electrode and a 1-2-th electrode spaced apart from each other, the second electrode being disposed between the 1-1-th electrode and the 1-2-th electrode. Each of the 1-1-th electrode and the 1-2-th electrode may be electrically connected to a same transistor of the at least one transistor.

In an embodiment of the disclosure, the display element layer may further include an auxiliary pattern provided in the emission area and electrically connecting one end of the 1-1-th electrode with one end of the 1-2-th electrode. The auxiliary pattern may be integral with the 1-1-th and the 1-2-th electrodes.

In an embodiment of the disclosure, at least one of the first and second contact holes may be provided in the emission area such that the at least one of the first and second contact holes corresponds to a portion of the auxiliary pattern.

In an embodiment of the disclosure, the display element layer may further include a conductive pattern disposed between the passivation layer and the bridge pattern in the peripheral area.

In an embodiment, the conductive pattern may overlap the bridge pattern in a plan view, and may be electrically disconnected from each of the first and the second electrodes.

In an embodiment of the disclosure, the display element layer may further include a first contact electrode disposed on the first electrode, and electrically connecting the first electrode with the first end of the at least one light emitting element; and a second contact electrode disposed on the second electrode, and electrically connecting the second electrode with the second end of the at least one light emitting element.

In an embodiment of the disclosure, the at least one light emitting element may include a light emitting diode having a shape of a cylinder or polyprism having a microscale or nanoscale size.

The display device may be fabricated by a method including forming a pixel circuit layer including at least one transistor on a substrate; and forming, on the pixel circuit layer, a display element layer including a plurality of emission areas that emit light, and a peripheral area provided around each of the plurality of emission areas.

In an embodiment of the disclosure, the forming of the display element layer may include forming a first electrode and a second electrode spaced apart from each other in each of the plurality of emission areas; forming, in the peripheral area, a 1-1-th connection line extending in a direction and a 2-1-th connection line provided parallel to the direction in which the 1-1-th connection line extends; forming a metal layer on the first and the second electrodes and the 1-1-th connection line; forming, on the 2-1-th connection line, a 2-2-th connection line including a material identical to a material of the metal layer; aligning a plurality of light emitting elements between the first and the second electrodes by applying an electric field between the first and the second electrodes; forming, by removing a portion of the metal layer, on the substrate including the plurality of light emitting elements, a capping layer overlapping each of the first and the second electrodes, a 1-2-th connection line overlapping the 1-1-th connection line, and a bridge pattern electrically disconnected from the capping layer; and forming the 1-2-th connection line and the bridge pattern to be in the peripheral area and electrically disconnected from each of the first and the second electrodes In an embodiment of the disclosure, the forming of the 1-2-th connection line and the bridge pattern may comprise forming the 1-2-th connection line and the bridge pattern to be integral with each other.

In an embodiment of the disclosure, the forming of the pixel circuit layer may comprise forming a passivation layer including a contact hole that exposes a portion of the at least one transistor and is provided in each of the plurality of emission areas such that the contact hole corresponds to a portion of the first electrode.

In an embodiment of the disclosure, the method may further comprise forming, on the first electrode, a first contact electrode electrically connecting the first electrode with one end of opposite ends of each of the plurality of light emitting elements; and forming, on the second electrode, a second contact electrode electrically connecting the second electrode with another end of the opposite ends of each of the plurality of light emitting elements.

Embodiments of the disclosure may provide a display device in which individual operation of each sub-pixel can be easily implemented in such a way that, after a connection line is disposed in a peripheral area enclosing an emission area and subminiature light emitting elements are aligned, the connection line is electrically disconnected.

Various embodiments of the disclosure may provide a method of fabricating the display device.

BRIEF DESCRIPTION OF THE DRAWINGS

The above and other embodiments and features of the disclosure will become more apparent by describing in detail embodiments thereof with reference to the attached drawings, in which:

FIG. 2 illustrates a display device in accordance with an embodiment of the disclosure, and specifically, is a schematic plan view illustrating a display device using the light emitting element illustrated in FIG. 1A as a light emitting source.

DETAILED DESCRIPTION OF THE EMBODIMENTS

Figure 1A:
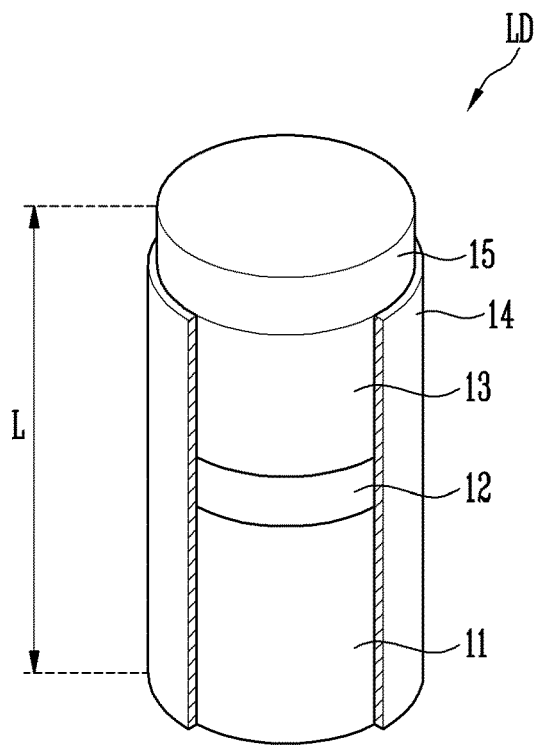
FIGS. 1A and 1B are schematic perspective views illustrating various types of light emitting elements in accordance with embodiments of the disclosure.

As the disclosure allows for various changes and numerous embodiments, particular embodiments will be illustrated in the drawings and described in detail in the written description. However, this is not intended to limit the disclosure to particular modes of practice, and it is to be appreciated that all changes, equivalents, and substitutes that do not depart from the spirit and technical scope of the disclosure are encompassed in the disclosure.

Throughout the disclosure, like reference numerals refer to like parts throughout the various figures and embodiments of the disclosure. The sizes of elements in the accompanying drawings may be exaggerated for clarity of illustration. It will be understood that, although the terms "first," "second," or the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element. In the disclosure, the singular forms may include the plural forms as well, or vice versa, unless the context clearly indicates otherwise.

It will be further understood that the terms "comprise," "include," "have," etc., when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, a region, or a plate is disposed on a second part, the first part may be directly on the second part or a third part may intervene between them. In addition, when it is expressed that a first part such as a layer, a film, a region, or a plate is disposed (or formed) on a second part, the surface of the second part on which the first part is disposed is not limited to an upper surface of the second part but may include other surfaces such as a side surface or a lower surface of the second part. Similarly, when a first part such as a layer, a film, a region, or a plate is under a second part, the first part may be not only directly under the second part, but a third part may intervene between them.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Embodiments of the disclosure will hereinafter be described in detail with reference to the accompanying drawings.

Figure 1B:
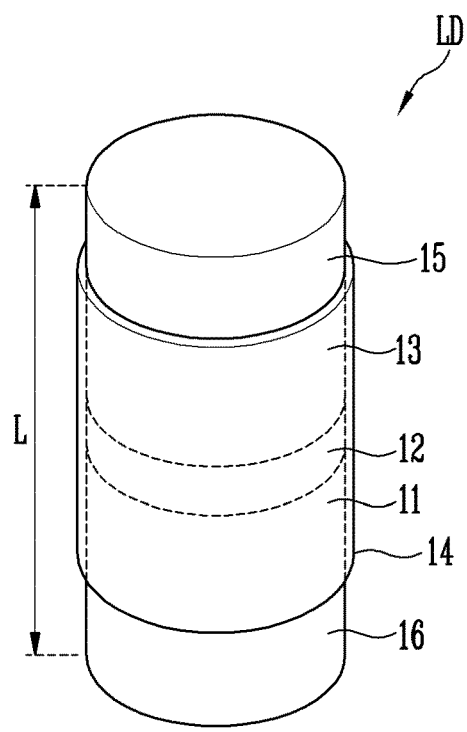

FIGS. 1A and 1B are schematic perspective views illustrating various types of light emitting elements in accordance with embodiments of the disclosure. Although FIGS. 1A and 1B illustrate cylindrical light emitting elements, the disclosure is not limited thereto.

Referring to FIGS. 1A and 1B, a light emitting element LD in accordance with an embodiment of the disclosure may include a first conductive semiconductor layer (or a first semiconductor layer) 11, a second conductive semiconductor layer (or a second semiconductor layer) 13, and an active layer 12 interposed between the first and second semiconductor layers 11 and 13.

For example, the light emitting element LD may be implemented as a stacked body or a stacked pattern which is formed by successively stacking the first conductive semiconductor layer 11, the active layer 12, and the second conductive semiconductor layer 13.

In an embodiment of the disclosure, the light emitting element LD may be provided in the form of a rod extending in one direction. If the direction in which the light emitting element LD extends is defined as a longitudinal direction (corresponding to a direction of length L), the light emitting element LD may have a first end and a second end in the longitudinal direction.

One of the first and second conductive semiconductor layers 11 and 13 may be disposed on the first end, and the other of the first and second conductive semiconductor layers 11 and 13 may be disposed on the second end.

Although the light emitting element LD may be provided in the form of a cylinder, the disclosure is not limited thereto. The light emitting element LD may include a rod-like shape or a bar-like shape extending in the longitudinal (L) direction (i.e., to have an aspect ratio greater than 1). For example, the length L of the light emitting element LD in the longitudinal (L) direction may be greater than the diameter thereof.

The light emitting element LD may include a light emitting diode fabricated in a subminiature size having a diameter and/or length having, e.g., a microscale or nanoscale size.

However, the size of the light emitting element LD is not limited to this, and the size of the light emitting element LD may be changed to meet specifications of a lighting device or a self-emissive display device that includes the light emitting element LD.

The first conductive semiconductor layer 11 may include, e.g., at least one n-type semiconductor layer. For instance, the first conductive semiconductor layer 11 may include a semiconductor layer which includes any one semiconductor material of InAlGaN, GaN, AlGaN, InGaN, AlN, and InN, and is doped with a first conductive dopant such as Si, Ge, or Sn.

The material forming the first conductive semiconductor layer 11 is not limited to this, and the first conductive semiconductor layer 11 may be formed of various other materials.

The active layer 12 may be formed on the first conductive semiconductor layer 11 and have a single- or multi-quantum well structure. In an embodiment of the disclosure, a cladding layer (not shown) doped with a conductive dopant may be formed on and/or under the active layer 12. For example, the cladding layer may be formed of an AlGaN layer or an InAlGaN layer. Material such as AlGaN or AlInGaN may be employed to form the active layer 12.

If an electric field of a predetermined voltage or more is applied to the opposite ends of the light emitting element LD, the light emitting element LD emits light by coupling of electron-hole pairs in the active layer 12.

The second conductive semiconductor layer 13 may be provided on the active layer 12 and may include a semiconductor layer having a type different from that of the first conductive semiconductor layer 11. For example, the second conductive semiconductor layer 13 may include at least one p-type semiconductor layer. For instance, the second conductive semiconductor layer 13 may include a semiconductor layer which includes any one semiconductor material of InAlGaN, GaN, AlGaN, InGaN, AlN, and InN, and is doped with a second conductive dopant such as Mg.

The material forming the second conductive semiconductor layer 13 is not limited to this, and the second conductive semiconductor layer 13 may be formed of various other materials.

In an embodiment of the disclosure, the light emitting element LD may further include one electrode layer 15 disposed on the second conductive semiconductor layer 13, as illustrated in FIG. 1A, as well as including the first conductive semiconductor layer 11, the active layer 12, and the second conductive semiconductor layer 13. In an embodiment, as shown in FIG. 1B, the light emitting element LD may further include another electrode layer 16 disposed on one end of the first conductive semiconductor layer 11 as well as including the electrode layer 15.

Although each of the electrode layers 15 and 16 may be formed of an ohmic contact electrode, the disclosure is not limited thereto. Each of the electrode layers 15 and 16 may include metal or a metal oxide. For example, chromium (Cr), titanium (Ti), aluminum (Al), gold (Au), nickel (Ni), ITO, and an oxide or alloy thereof may be used alone or in combination with each other. However, the disclosure is not limited to this.

Materials included in the respective electrode layers 15 and 16 may be identical to or different from each other.

The electrode layers 15 and 16 may be transparent or semitransparent. Therefore, light generated from the light emitting element LD may pass through the electrode layers 15 and 16 and then may be emitted outside the light emitting element LD.

In an embodiment of the disclosure, the light emitting element LD may further include an insulating film 14. In an embodiment, the insulating film 14 may be omitted, or may be provided to cover or overlap only some of the first conductive semiconductor layer 11, the active layer 12, and the second conductive semiconductor layer 13.

As illustrated in FIG. 1A, the insulating film 14 may be provided on a portion of the light emitting element LD other than one of opposite ends of the light emitting element LD. In this case, the insulating film 14 may expose only the one electrode layer 15 disposed on one end of the second conductive semiconductor layer 13 of the light emitting element LD and may enclose the overall side surfaces of the components other than the electrode layer 15. Here, the insulating film 14 may allow at least the opposite ends of the light emitting element LD to be exposed to the outside. For example, the insulating film 14 may allow not only the electrode layer 15 disposed on one end of the second conductive semiconductor layer 13 but also one end of the first conductive semiconductor layer 11 to be exposed to the outside.

In an embodiment, as shown in FIG. 1B, in the case where the electrode layers 15 and 16 are disposed on the respective opposite ends of the light emitting element LD, the insulating film 14 may allow at least a portion of each of the electrode layers 15 and 16 to be exposed to the outside. As another example, in an embodiment, the insulating film 14 may not be provided.

In an embodiment of the disclosure, the insulating film 14 may include a transparent insulating material. For example, the insulating film 14 may include at least one insulating material selected from the group consisting of $SiO_2$, $Si_3N_4$, $Al_2O_3$, and $TiO_2$, but it is not limited thereto. In other words, various materials having insulating properties may be employed.

If the insulating film 14 is provided on the light emitting element LD, the active layer 12 may be prevented from short-circuiting with a first electrode and/or a second electrode which is not illustrated.

Thanks to the insulating film 14, occurrence of a defect on the surface of the light emitting element LD may be minimized, whereby the lifetime and efficiency of the light emitting element LD may be improved. In the case where light emitting elements LD are disposed in close contact with each other, the insulating film 14 may prevent an undesired short-circuit from occurring between the light emitting elements LD.

The light emitting element LD may be employed as a light source for various display devices. The light emitting element LD may be fabricated through a surface treatment process.

FIG. 2 illustrates a display device in accordance with an embodiment of the disclosure, and specifically, is a schematic plan view illustrating a display device using the light emitting element illustrated in FIG. 1A as a light emitting source.

For the sake of explanation, FIG. 2 schematically illustrates the structure of the display device, focused on a display area on which an image is displayed. In some embodiments, although not illustrated, at least one driving circuit (e.g., a scan driver and a data driver) and/or lines may be further provided in the display device.

Referring to FIGS. 1A and 2, the display device in accordance with the embodiment of the disclosure may include a substrate SUB, pixels PXL provided on the substrate SUB and each including at least one light emitting element LD, a driver (not illustrated) provided on the substrate SUB and configured to drive the pixels PXL, and a line component (not illustrated) provided to electrically connect the pixels PXL with the driver.

The display device may be classified into a passive-matrix type display device and an active-matrix type display device according to a method of driving the light emitting element LD. For example, in the case where the display device is implemented as an active-matrix type, each of the pixels PXL may include a driving transistor configured to control the amount of current to be supplied to the light emitting element LD, and a switching transistor configured to transmit data signals to the driving transistor.

Recently, active-matrix type display devices capable of selectively turning on each pixel PXL taking into account the resolution, the contrast, and the working speed have been mainstreamed. However, the disclosure is not limited thereto. For example, passive-matrix type display devices in which a group of pixels PXL may be turned on may also employ components (e.g., first and second electrodes) for driving the light emitting element LD.

The substrate SUB may include a display area DA and a non-display area NDA.

In an embodiment, the display area DA may be disposed in a central portion of the display device, and the non-display area NDA may be disposed in a perimeter portion of the display device in such a way as to surround the display area DA. The locations of the display area DA and the non-display area NDA are not limited to this, and the locations thereof may be changed.

The display area DA may be an area in which the pixels PXL for displaying an image are provided. The non-display area NDA may be an area in which the driver for driving the pixels PXL and some of the line component for electrically connecting the pixels PXL to the driver are provided.

The display area DA may have various shapes. For example, the display area DA may be provided in various forms such as a closed polygon including sides formed of linear lines, a circle, an ellipse or the like including a side formed of a curved line, and a semicircle, a semiellipse or the like including sides formed of a linear line and a curved line.

The non-display area NDA may be provided on at least one side of the display area DA. In an embodiment of the disclosure, the non-display area NDA may enclose the periphery of the display area DA.

The pixels PXL may be provided in the display area DA on the substrate SUB. Each of the pixels PXL refers to a smallest unit for displaying the image, and pixels PXL may be provided.

Each of the pixels PXL may include the light emitting element LD configured to be driven in response to a corresponding scan signal and a corresponding data signal. The light emitting element LD may have a small size, e.g., a nanoscale or microscale size, and be connected in parallel to light emitting elements disposed adjacent thereto. The light emitting element LD may form a light source of the corresponding pixel PXL.

The pixels PXL may be arranged in a matrix form along rows extending in a first direction DR1 and columns extending in a second direction DR2 intersecting the first direction DR1. However, the arrangement of the pixels PXL is not limited to a particular arrangement. In other words, the pixels PXL may be arranged in various forms.

The driver may provide a signal to each pixel PXL through the line component and thus control the operation of the pixel PXL. In FIG. 2, for the sake of explanation, the line component is omitted.

The driver may include a scan driver configured to provide a scan signal to the pixels PXL through a scan line, an emission driver configured to provide an emission control signal to the pixels PXL through an emission control line, a data driver configured to provide a data signal to the pixels PXL through a data line, and a timing controller. The timing controller may control the scan driver, the emission driver, and the data driver.

Figure 3A:
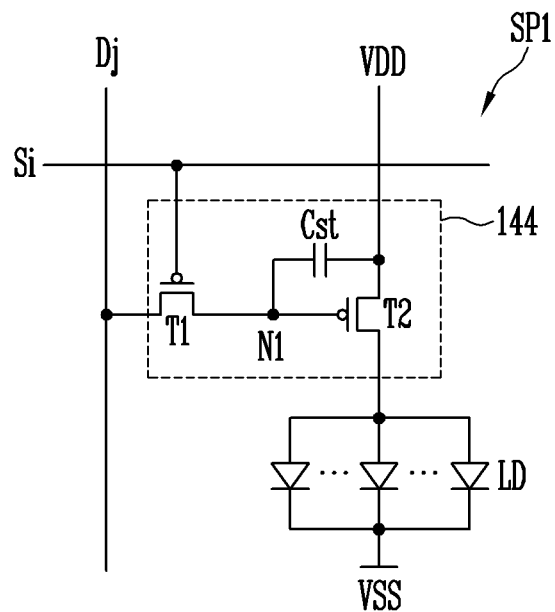
FIGS. 3A to 3C are schematic circuit diagrams illustrating examples of a first sub-pixel of first to third sub-pixels of the display device of FIG. 2 in accordance with various embodiments.
Figure 3B:
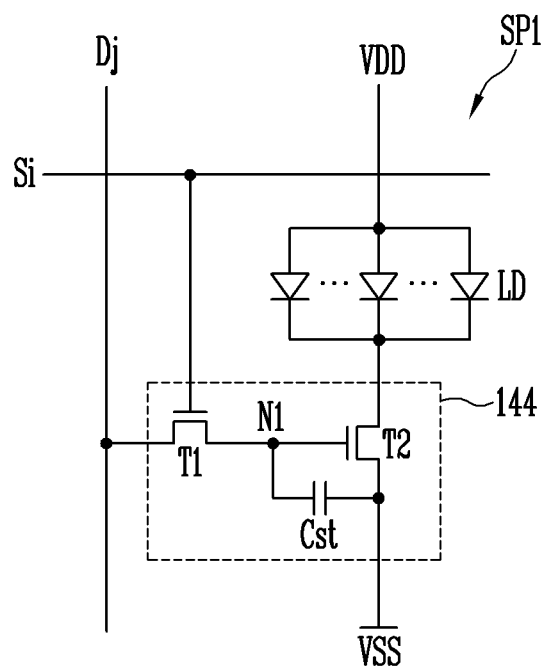
Figure 3C:
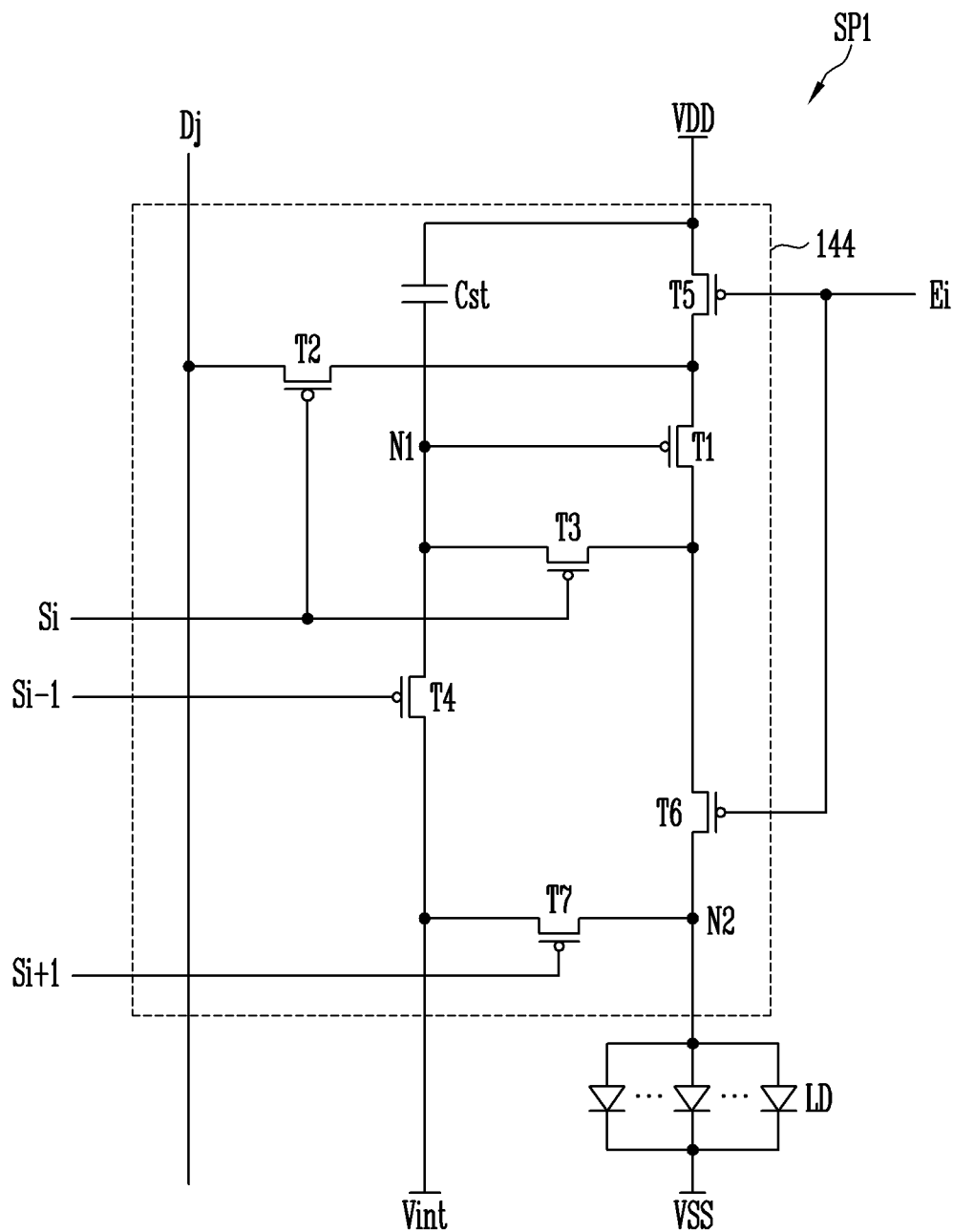

FIGS. 3A to 3C are schematic circuit diagrams illustrating examples of a first sub-pixel of first to third sub-pixels of the display device of FIG. 2 in accordance with various embodiments.

Referring to FIGS. 3A to 3C, each of the first to third sub-pixels may include an active pixel. However, the type, the configuration, and/or the driving method of each of the first to third sub-pixels is not particularly limited. For example, each of the first to third sub-pixels may include a pixel of a passive or active display device which can have any of various known structures.

Still referring to FIGS. 3A to 3C, the first to third sub-pixels may have substantially the same structure or similar structures. Hereinafter, for the sake of convenience, the first sub-pixel of the first to third sub-pixels will be described as a representative example.

Referring to FIGS. 1A, 2, and 3A, the first sub-pixel SP1 may include light emitting elements LD connected in parallel to each other between a first driving power supply VDD and a second driving power supply VSS, and a pixel driving circuit 144 electrically connected with the light emitting elements LD and configured to drive the light emitting elements LD.

A first electrode (e.g., an anode electrode) of each of the light emitting elements LD may be electrically connected to the first driving power supply VDD via the pixel driving circuit 144. A second electrode (e.g., a cathode electrode) of each of the light emitting elements LD may be electrically connected to a second driving power supply VSS.

The first driving power supply VDD and the second driving power supply VSS may have different potentials. For example, the second driving power supply VSS may have a potential lower than that of the first driving power supply VDD by a value equal to or greater than a threshold voltage of the light emitting elements LD.

Each of the light emitting elements LD may emit light at a luminance corresponding to driving current that is controlled by the pixel driving circuit 144.

Although FIGS. 3A to 3C illustrate embodiments in which the light emitting elements LD are electrically connected in parallel to each other in the same direction (e.g., a forward direction) between the first and second driving power supplies VDD and VSS, the disclosure is not limited thereto. For example, in an embodiment, some of the light emitting elements LD may be electrically connected in the forward direction between the first and second driving power supplies VDD and VSS, and the other light emitting elements LD may be electrically connected in a reverse direction. One of the first and second driving power supplies VDD and VSS may be supplied in the form of alternating voltage. In this case, groups of the light emitting elements LD in the same connection directions may alternately emit light. As another example, in an embodiment, the first sub-pixel SP1 may include a single light emitting element LD.

In an embodiment of the disclosure, the pixel driving circuit 144 may include first and second transistors T1 and T2, and a storage capacitor Cst. However, the structure of the pixel driving circuit 144 is not limited to the embodiment illustrated in FIG. 3A.

A first electrode of the first transistor T1 (switching transistor) is electrically connected to a data line Dj, and a second electrode thereof is electrically connected to a first node N1. Here, the first electrode and the second electrode of the first transistor T1 may be different electrodes. For example, if the first electrode is a source electrode, the second electrode is a drain electrode. A gate electrode of the first transistor T1 is electrically connected to the scan line Si.

In case that a scan signal having a voltage (e.g., a low-level voltage) capable of turning on the first transistor T1 is supplied from the scan line Si, the first transistor T1 is turned on to electrically connect the data line Dj with the first node N1. Here, a data signal of a corresponding frame is supplied to the data line Dj, whereby the data signal is transmitted to the first node N1. The storage capacitor Cst is charged with the data signal transmitted to the first node N1.

The second transistor T2 (driving transistor) may include a first electrode electrically connected to the first driving power supply VDD, and a second electrode electrically coupled to the first electrode of each of the light emitting elements LD. A gate electrode of the second transistor T2 is electrically connected to the first node N1. The second transistor T2 may control the amount of driving current to be supplied to the light emitting elements LD in response to the voltage of the first node N1.

One electrode of the storage capacitor Cst is electrically connected to the first driving power supply VDD, and the other electrode thereof is electrically connected to the first node N1. The storage capacitor Cst may be charged with a voltage corresponding to the data signal supplied to the first node N1 and may maintain the charged voltage until a data signal of a subsequent frame is supplied.

For the sake of explanation, FIG. 3A illustrates the pixel driving circuit 144 having a relatively simple structure including the first transistor T1 configured to transmit the data signal to the first sub-pixel SP1, the storage capacitor Cst configured to store the data signal, and the second transistor T2 configured to supply driving current corresponding to the data signal to the light emitting elements LD.

However, the disclosure is not limited to the foregoing structure, and the structure of the pixel driving circuit 144 may be changed in various ways. For example, the pixel driving circuit 144 may further include at least one transistor element such as a transistor element configured to compensate for the threshold voltage of the second transistor T2, a transistor element configured to initialize the first node N1, and/or a transistor element configured to control an emission time of the light emitting element LD, or other circuit elements such as a boosting capacitor for boosting the voltage of the first node N1.

Although in FIG. 3A the transistors, e.g., the first and second transistors T1 and T2, included in the pixel driving circuit 144 have been illustrated as being P-type transistors, the disclosure is not limited to this. In other words, at least one of the first and second transistors T1 and T2 included in the pixel driving circuit 144 may be an N-type transistor.

Referring to FIGS. 1A, 2, and 3B, the first and second transistors T1 and T2 in accordance with an embodiment of the disclosure may be N-type transistors. The configuration and operation of the pixel driving circuit 144 illustrated in FIG. 3B, other than a change in connection positions of some components due to a change in the type of transistor, are similar to those of the pixel driving circuit 144 of FIG. 3A. Therefore, detailed descriptions pertaining to this will be omitted.

In an embodiment of the disclosure, the configuration of the pixel driving circuit 144 is not limited to the embodiments illustrated in FIGS. 3A and 3B. For example, the pixel driving circuit 144 may be configured in the same manner as that of an embodiment illustrated in FIG. 3C.

Referring to FIGS. 1A, 2, and 3C, the pixel driving circuit 144 may be electrically connected to the scan line Si and the data line Dj of the first sub-pixel SP1. For example, if the first sub-pixel SP1 is disposed on an i-th row and a j-th column of the display area DA, the pixel driving circuit 144 of the first sub-pixel SP1 may be electrically connected to an i-th scan line Si and a j-th data line Dj of the display area DA.

In an embodiment, the pixel driving circuit 144 may be further electrically connected to at least one scan line. For example, the first sub-pixel SP1 disposed on the i-th row of the display area DA may be further electrically connected to an i−1-th scan line Si−1 and/or an i+1-th scan line Si+1.

In an embodiment, the pixel driving circuit 144 may be electrically connected not only to the first and second driving power supplies VDD and VSS but also to a third power supply. For example, the pixel driving circuit 144 may also be electrically connected to an initialization power supply Vint.

Here, the pixel driving circuit 144 may include first to seventh transistors T1 to T7, and a storage capacitor Cst.

The first transistor (driving transistor) T1 may include a first electrode, e.g., a source electrode, electrically connected to the first driving power supply VDD via the fifth transistor T5, and a second electrode, e.g., a drain electrode, electrically connected to one end of light emitting elements LD via the sixth transistor T6. A gate electrode of the first transistor T1 may be electrically connected to a first node N1. The first transistor T1 may control driving current flowing between the first driving power supply VDD and the second driving power supply VSS via the light emitting elements LD in response to the voltage of the first node N1.

The second transistor (switching transistor) T2 may be electrically connected between the j-th data line Dj electrically connected to the first sub-pixel SP1 and the source electrode of the first transistor T1. A gate electrode of the second transistor T2 is electrically connected to the i-th scan line Si electrically connected to the first sub-pixel SP1. In case that a scan signal having a gate-on voltage (e.g., a low-level voltage) is supplied from the i-th scan line Si, the second transistor T2 is turned on to electrically connect the j-th data line Dj to the source electrode of the first transistor T1. Hence, if the second transistor T2 is turned on, a data signal supplied from the j-th data line Dj may be transmitted to the first transistor T1.

The third transistor T3 is electrically connected between the drain electrode of the first transistor T1 and the first node N1. A gate electrode of the third transistor T3 may be electrically connected to the i-th scan line Si. In case that a scan signal having a gate-on voltage is supplied from the i-th scan line Si, the third transistor T3 may be turned on to electrically connect the drain electrode of the first transistor T1 to the first node N1. Therefore, in case that the third transistor T3 is turned on, the first transistor T1 may be diode-connected.

The fourth transistor T4 is electrically connected between the first node N1 and the initialization power supply Vint. A gate electrode of the fourth transistor T4 is electrically connected to a previous scan line, e.g., an i−1-th scan line Si−1. In case that a scan signal of a gate-on voltage is supplied to the i−1-th scan line Si−1, the fourth transistor T4 may be turned on so that the voltage of the initialization power supply Vint may be transmitted to the first node N1. Here, the initialization power supply Vint may have a voltage equal to or less than the minimum voltage of the data signal.

The fifth transistor T5 is electrically connected between the first driving power supply VDD and the first transistor T1. A gate electrode of the fifth transistor T5 may be electrically connected to a corresponding emission control line, e.g., an i-th emission control line Ei. The fifth transistor T5 may be turned off in case that an emission control signal having a gate-off voltage is supplied to the i-th emission control line Ei and may be turned on in other cases.

The sixth transistor T6 is electrically connected between the first transistor T1 and first ends of the light emitting elements LD. A gate electrode of the sixth transistor T6 is electrically connected to the i-th emission control line Ei. The sixth transistor T6 may be turned off in case that an emission control signal having a gate-off voltage is supplied to the i-th emission control line Ei, and may be turned on in other cases.

The seventh transistor T7 is electrically connected between the first ends of the light emitting elements LD and the initialization power supply Vint. A gate electrode of the seventh transistor T7 is electrically connected to any one of scan lines of a subsequent stage, e.g., to the i+1-th scan line Si+1. In case that a scan signal of a gate-on voltage is supplied to the i+1-th scan line Si+1, the seventh transistor T7 may be turned on so that the voltage of the initialization power supply Vint may be supplied to a second node N2, which is electrically connected to the first ends of the light emitting elements LD.

The storage capacitor Cst may be electrically connected between the first driving power supply VDD and the first node N1. The storage capacitor Cst may store a voltage corresponding to the data signal applied to the first node N1 during each frame period and/or to the threshold voltage of the first transistor T1.

For the sake of convenience, FIG. 3C illustrates that all of the first to seventh transistors T1 to T7 are P-type transistors, but the disclosure is not limited thereto. For example, at least one of the first to seventh transistors T1 to T7 included in the pixel driving circuit 144 may be an N-type transistor, or all of the first to seventh transistors T1 to T7 may be N-type transistors.

Figure 4:
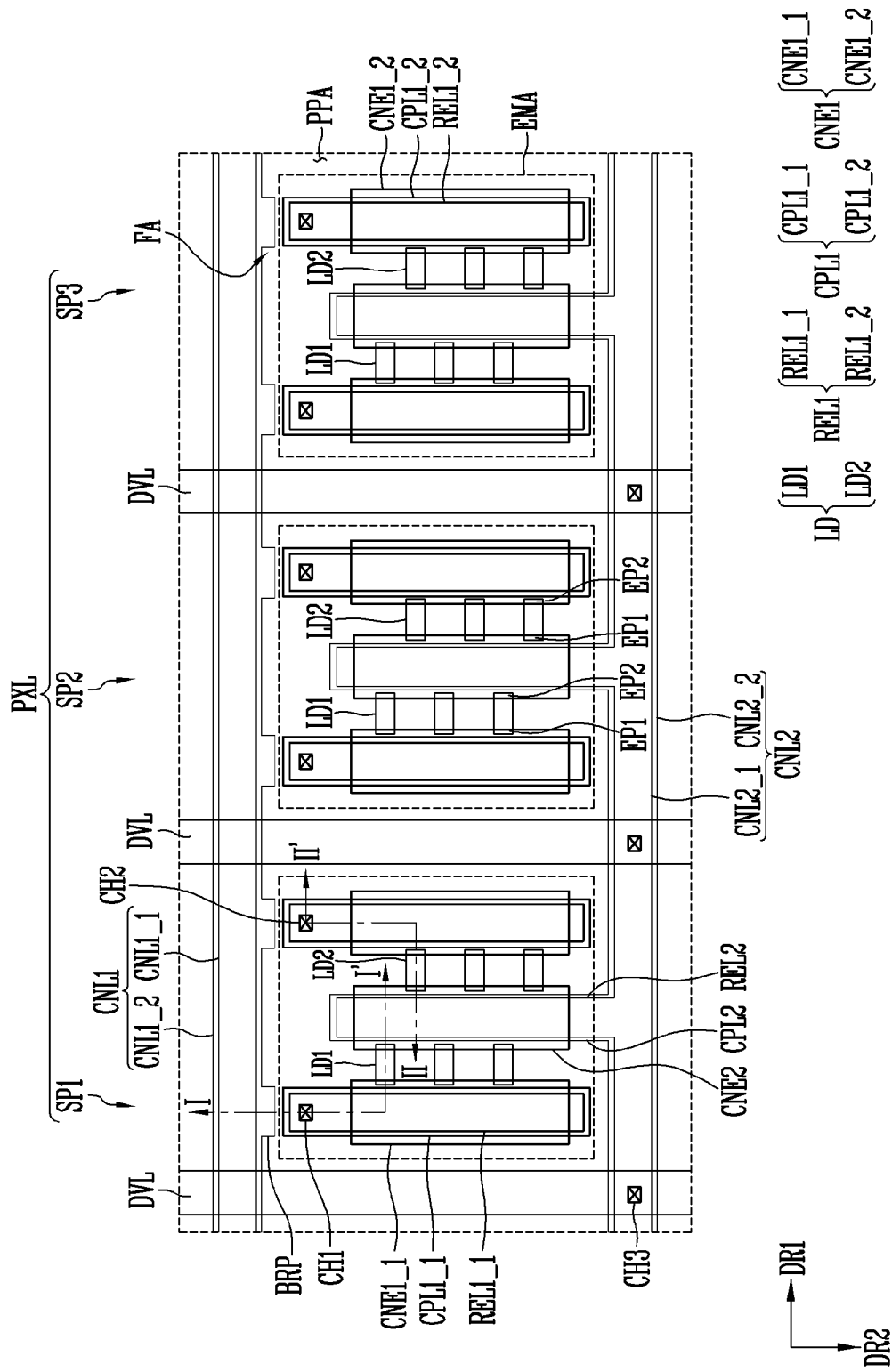
FIG. 4 is a schematic plan view illustrating first to third sub-pixels included in one of pixels illustrated in FIG. 2.
Figure 5A:
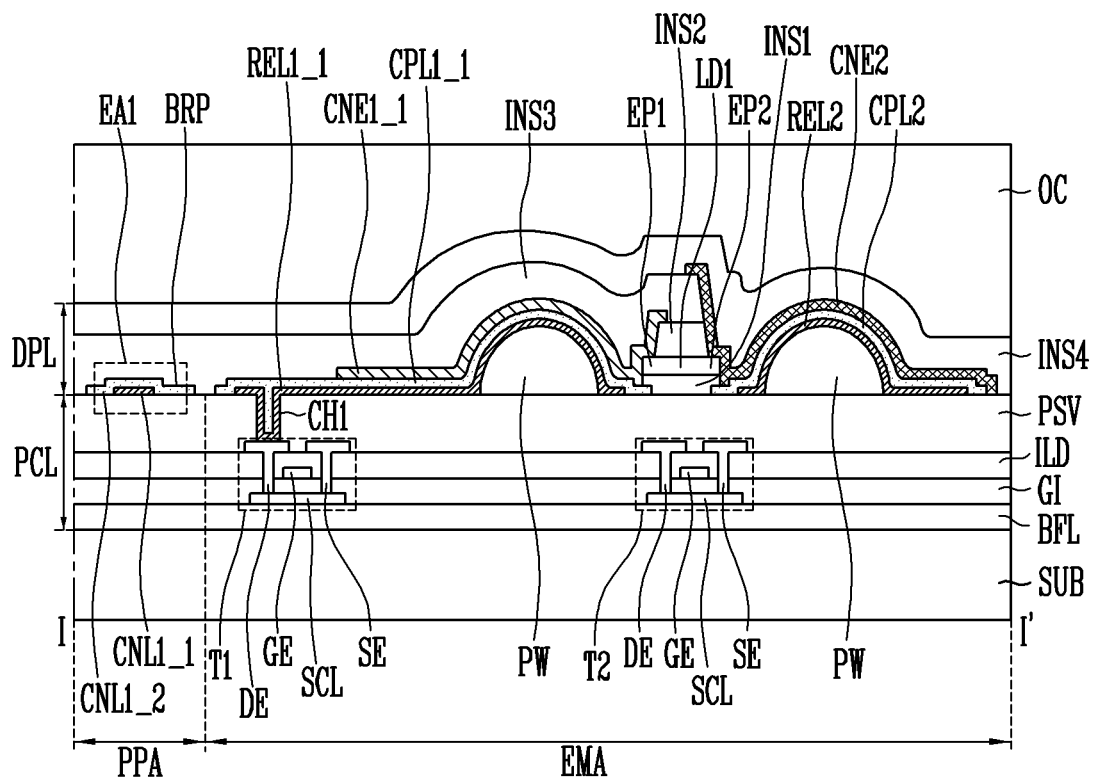
FIG. 5A is a schematic cross-sectional view taken along line I-I' of FIG. 4.
Figure 5B:
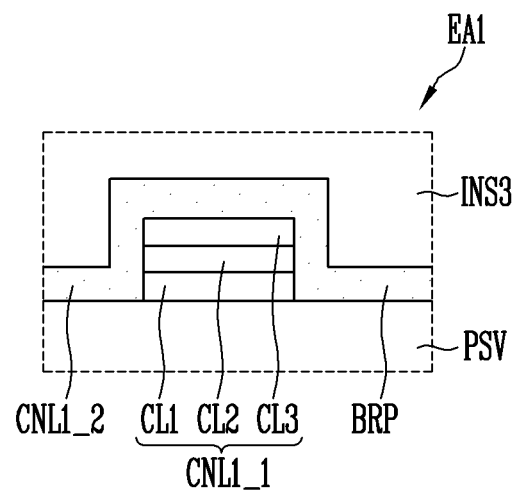
FIG. 5B is a schematic enlarged cross-sectional view of area EA1 of FIG. 5A.
Figure 6:
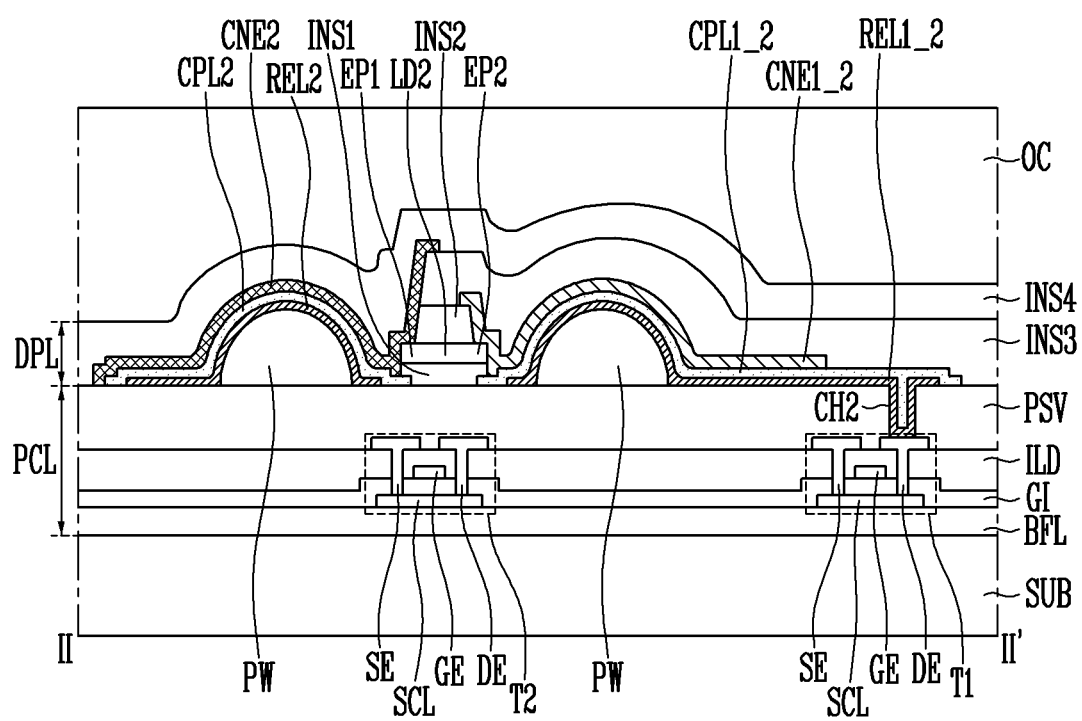
FIG. 6 is a schematic cross-sectional view taken along line II-II' of FIG. 4.
Figure 7A:
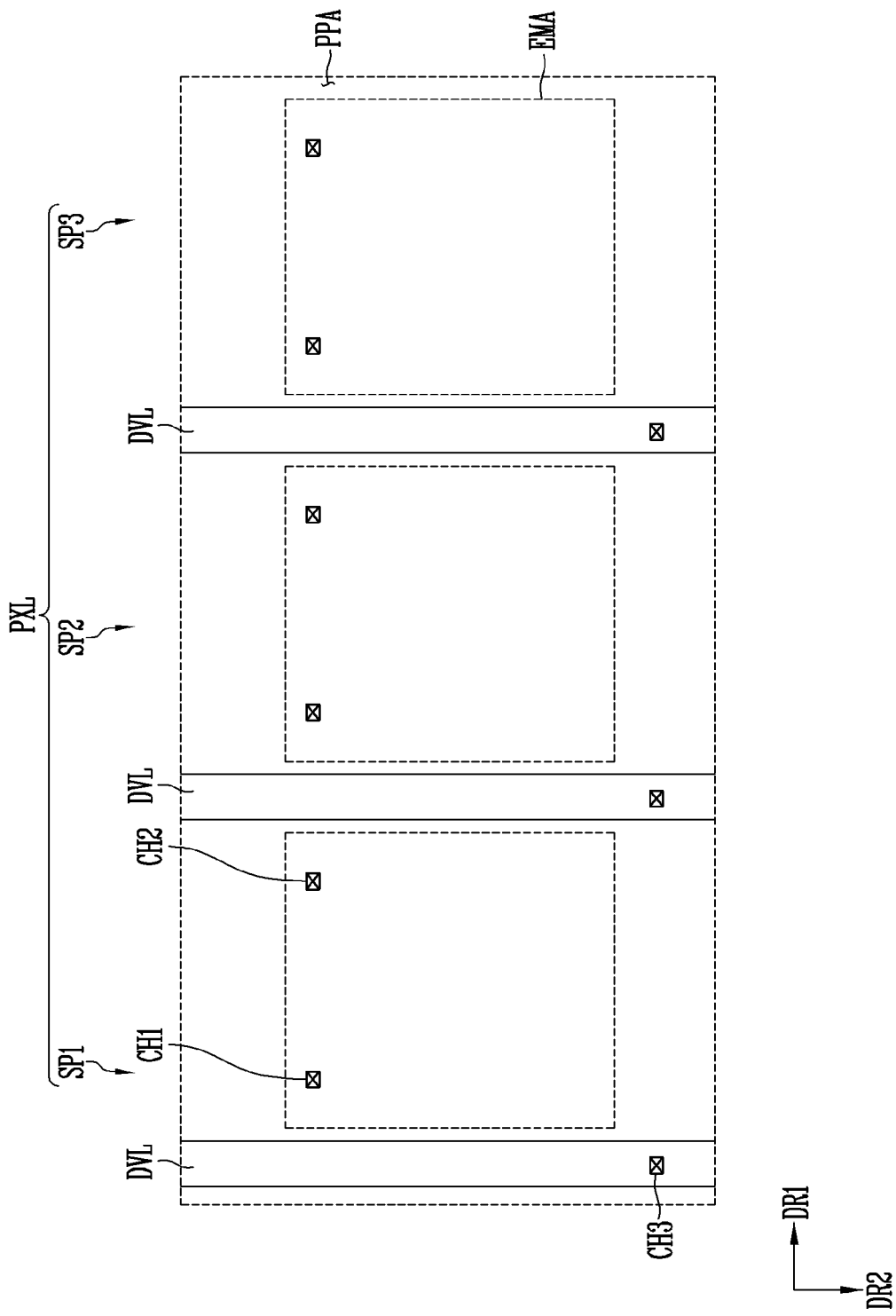
FIGS. 7A to 7G are schematic plan views sequentially illustrating a method of fabricating the display device corresponding to FIG. 4.
Figure 7B:
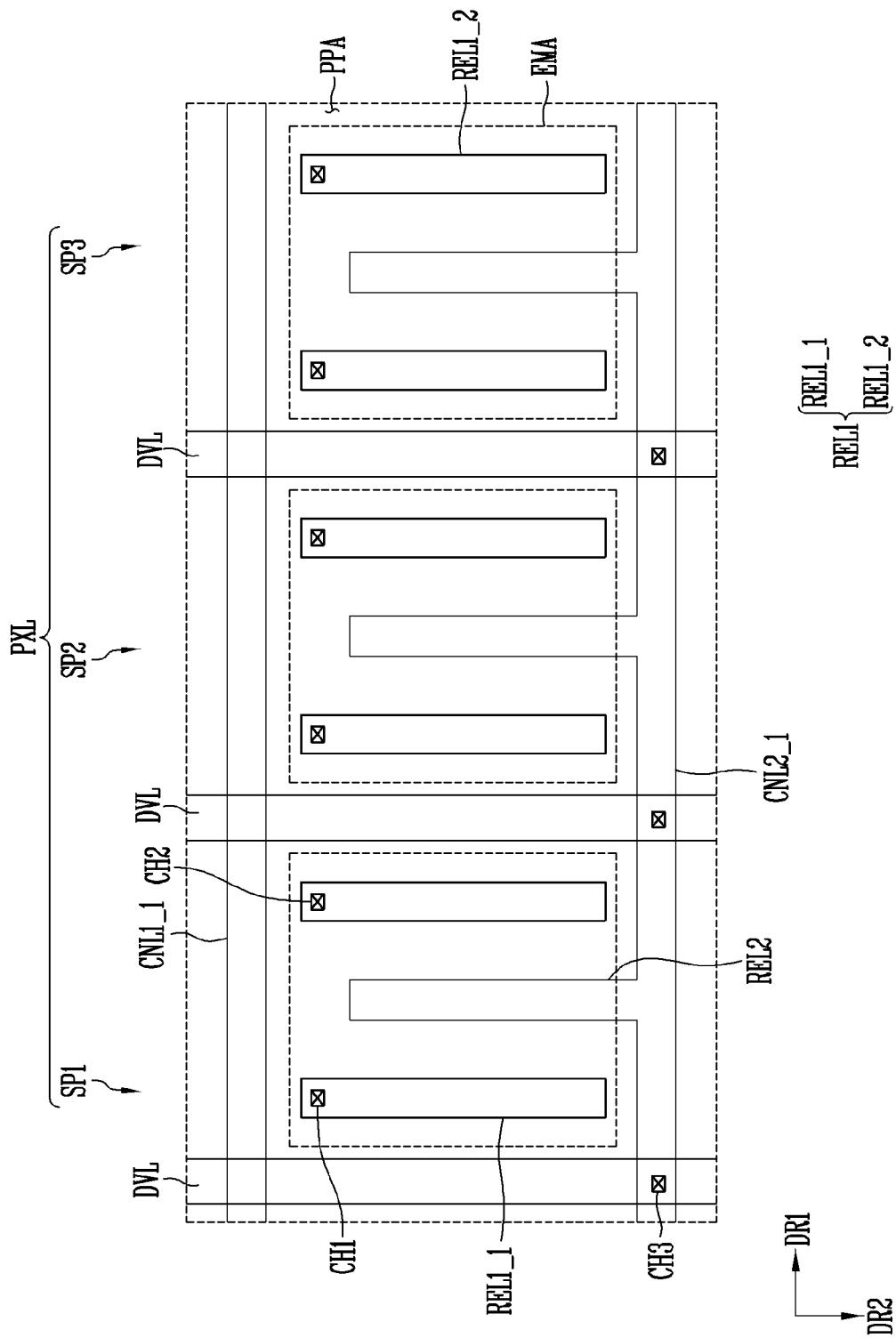
Figure 7C:
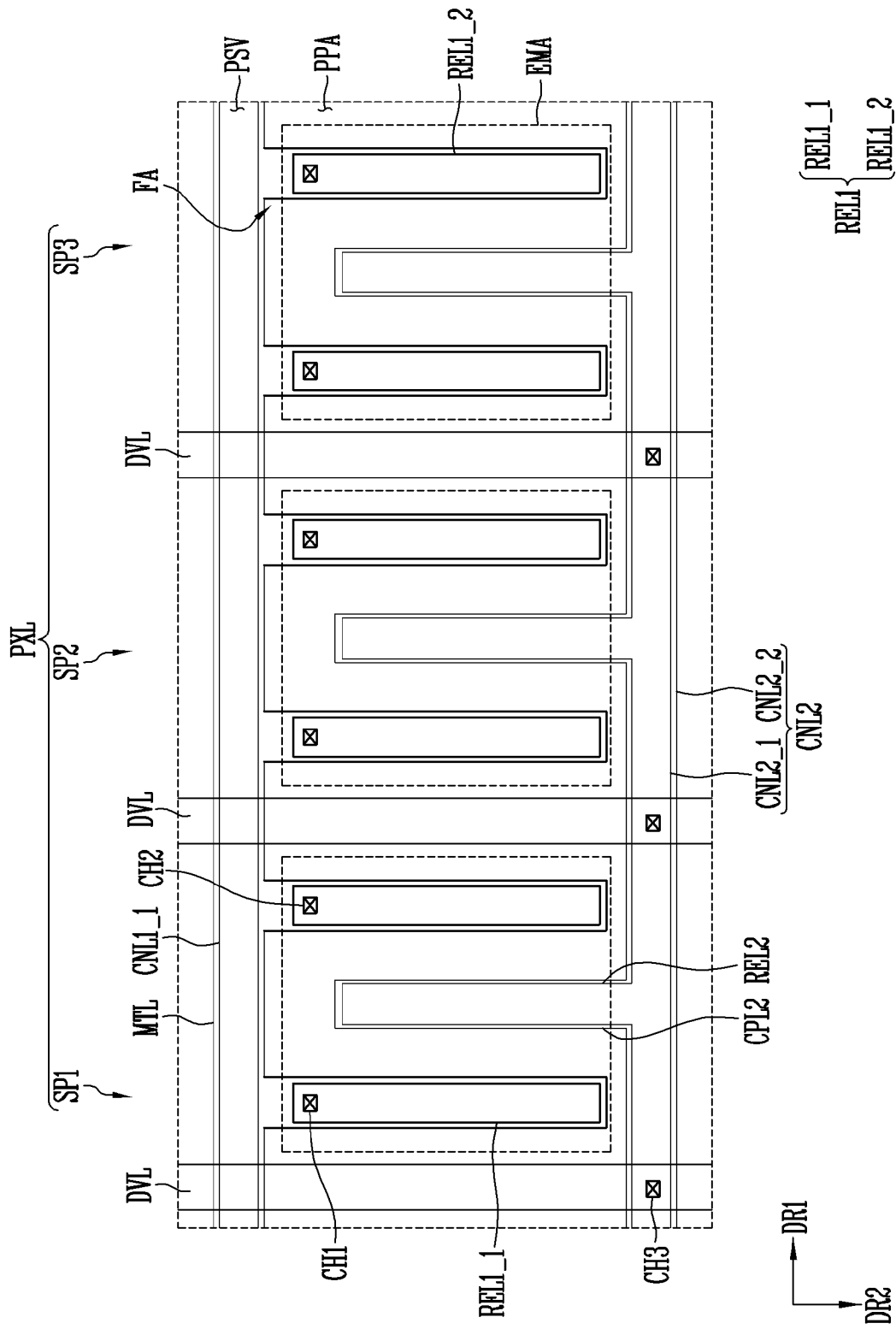
Figure 7D:
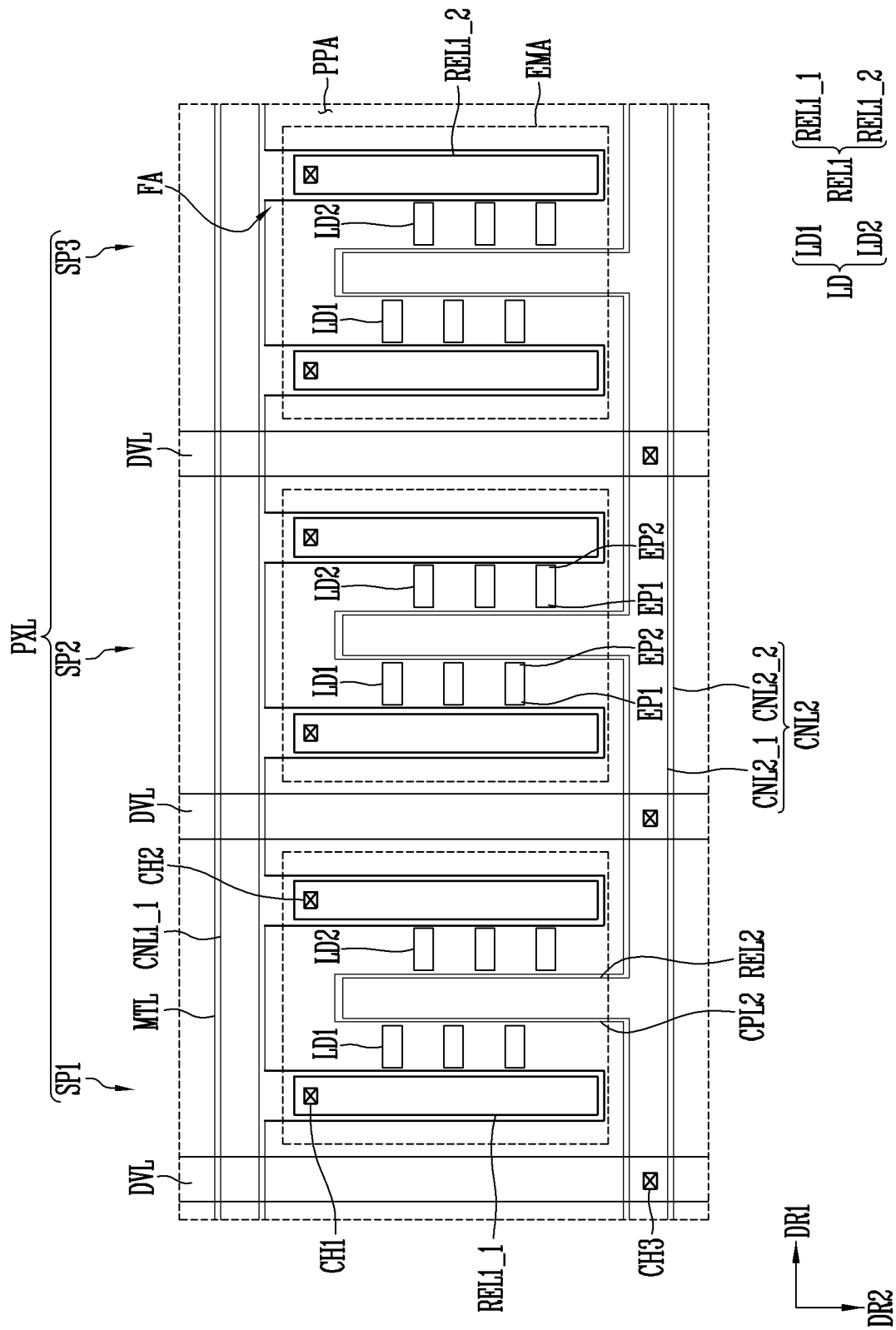
Figure 7E:
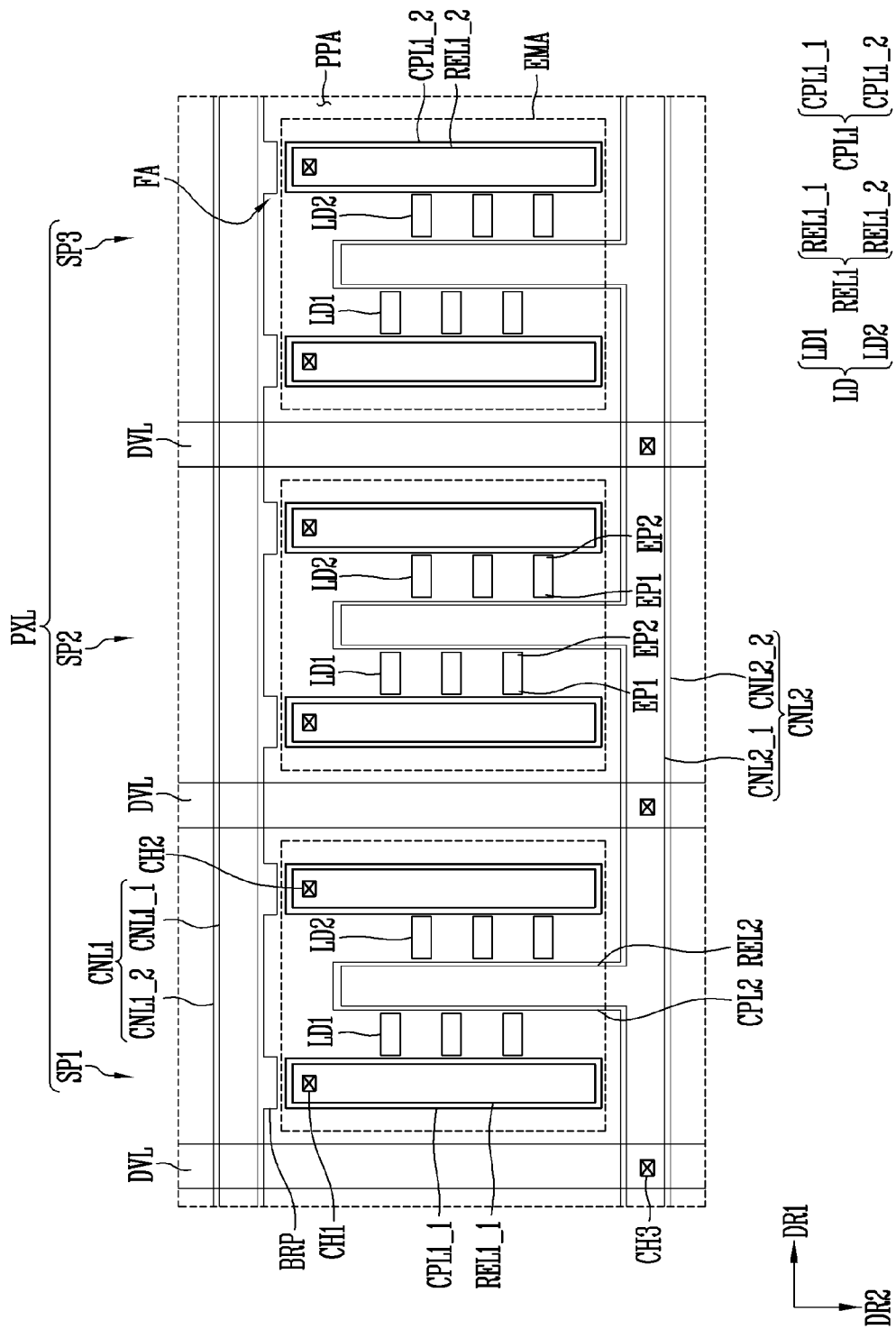
Figure 7F:
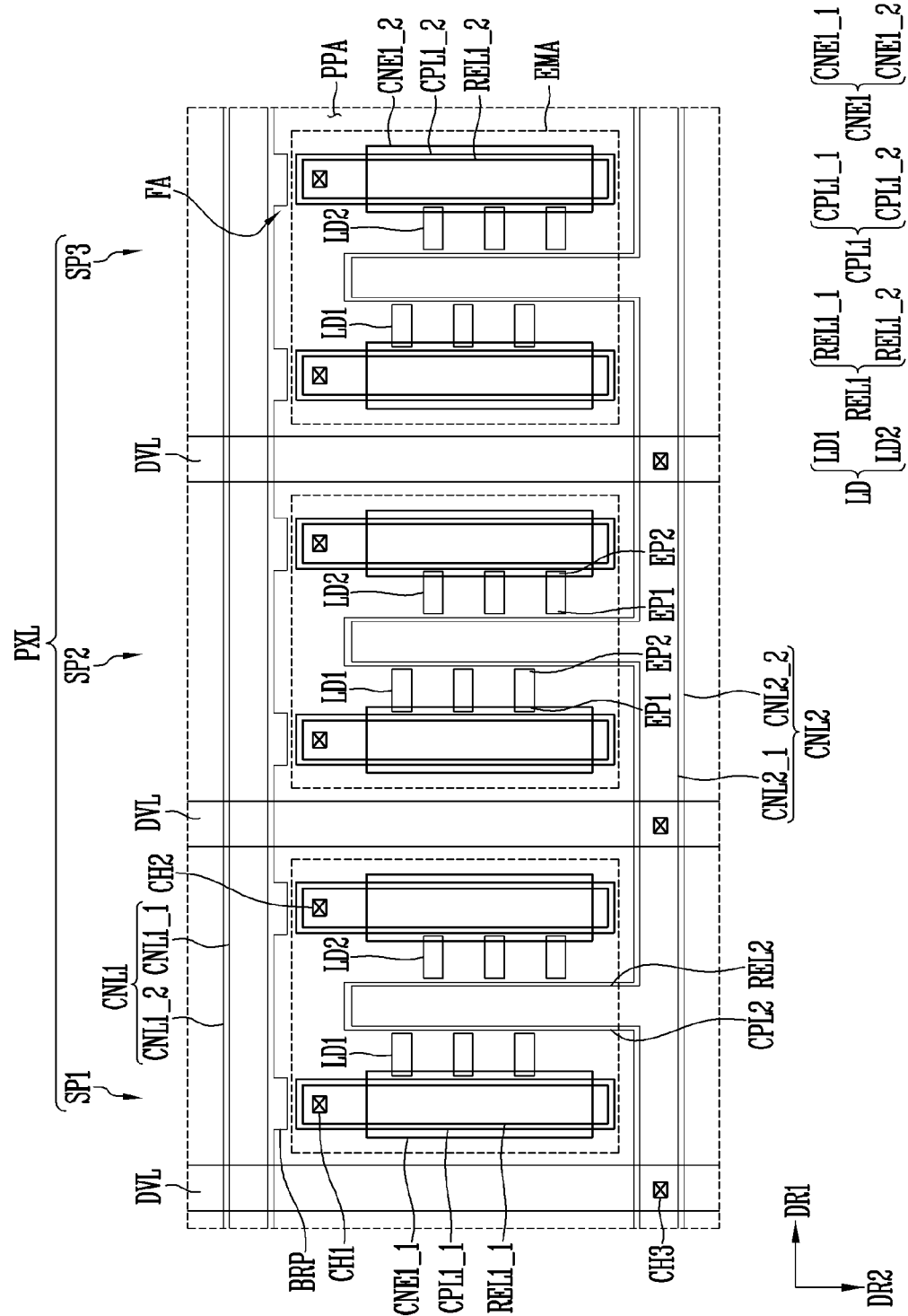
Figure 7G:
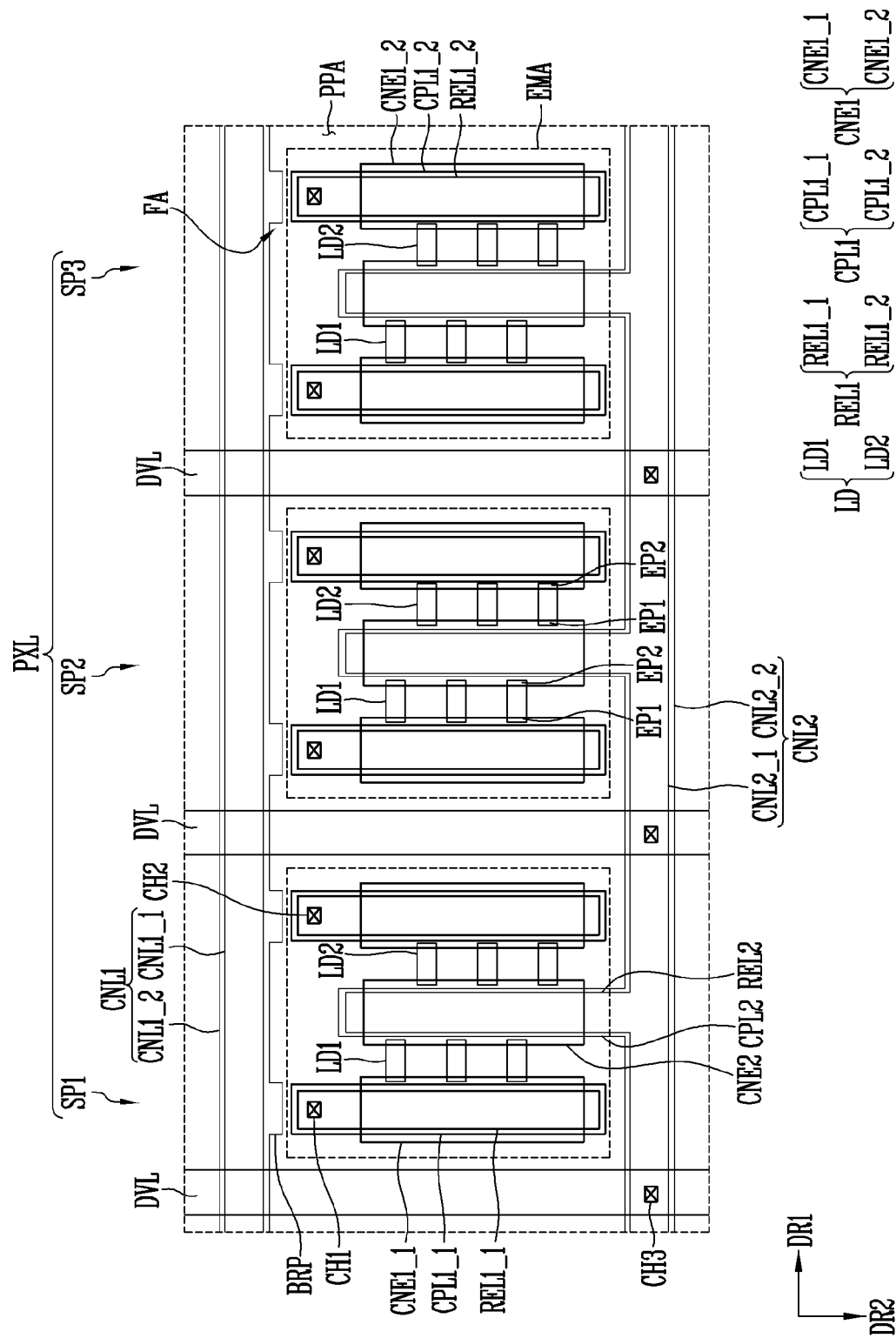
Figure 8A:
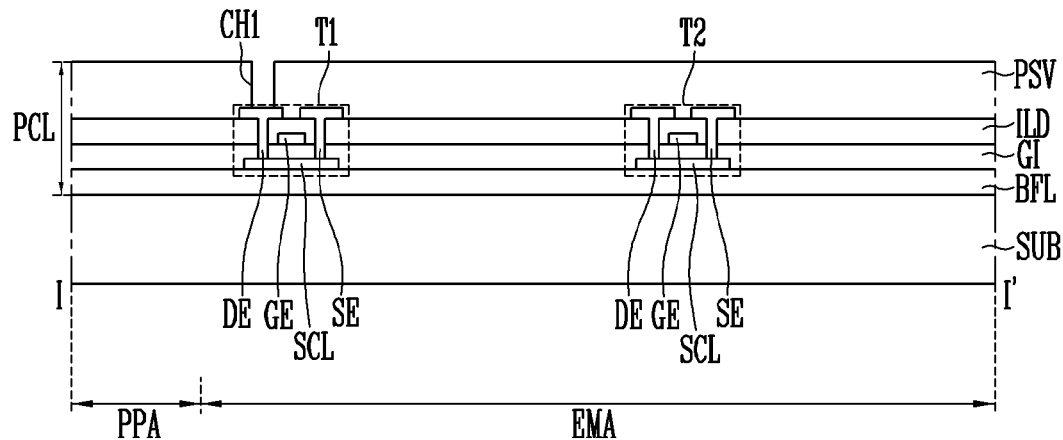
FIGS. 8A to 8J are schematic cross-sectional views sequentially illustrating a method of fabricating the display device corresponding to FIG. 5A.
Figure 8B:
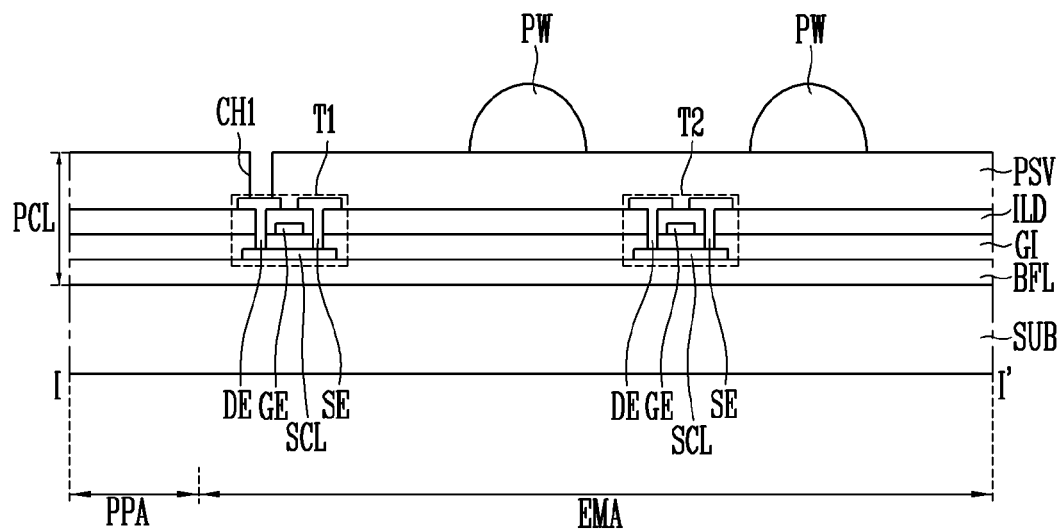
Figure 8C:
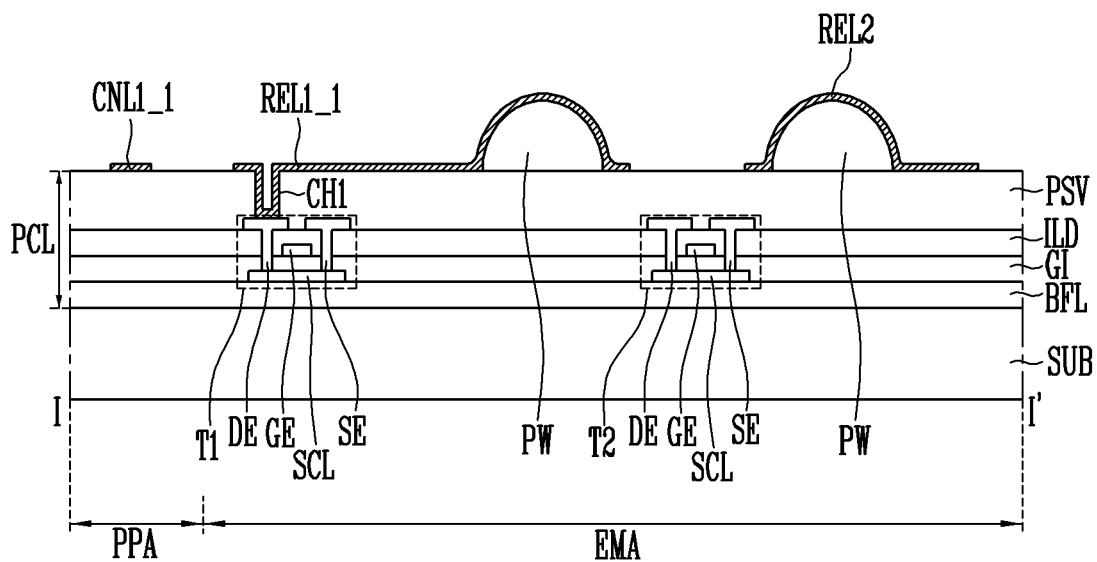
Figure 8D:
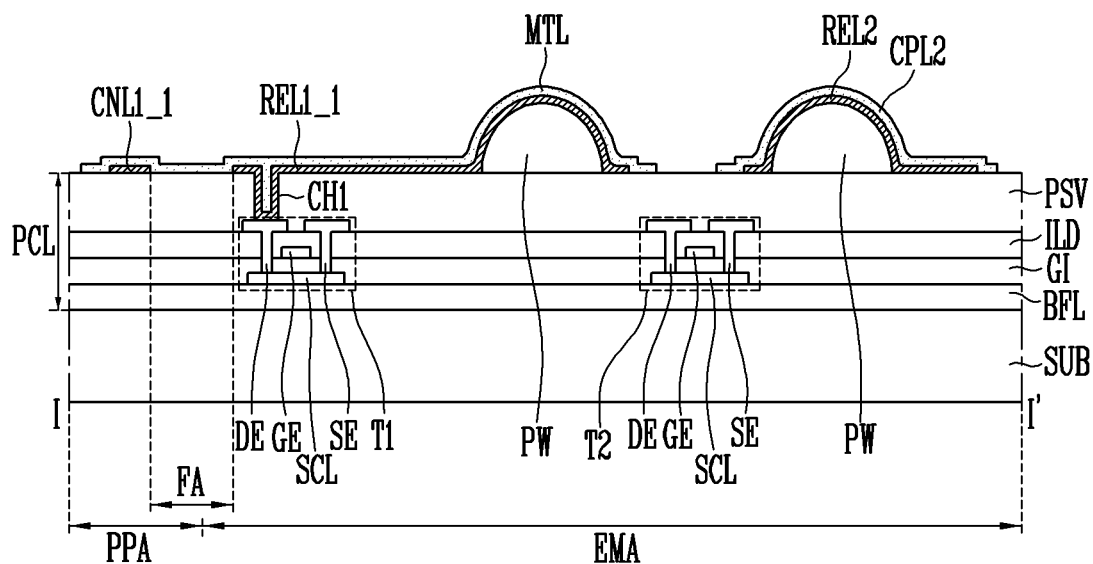
Figure 8E:
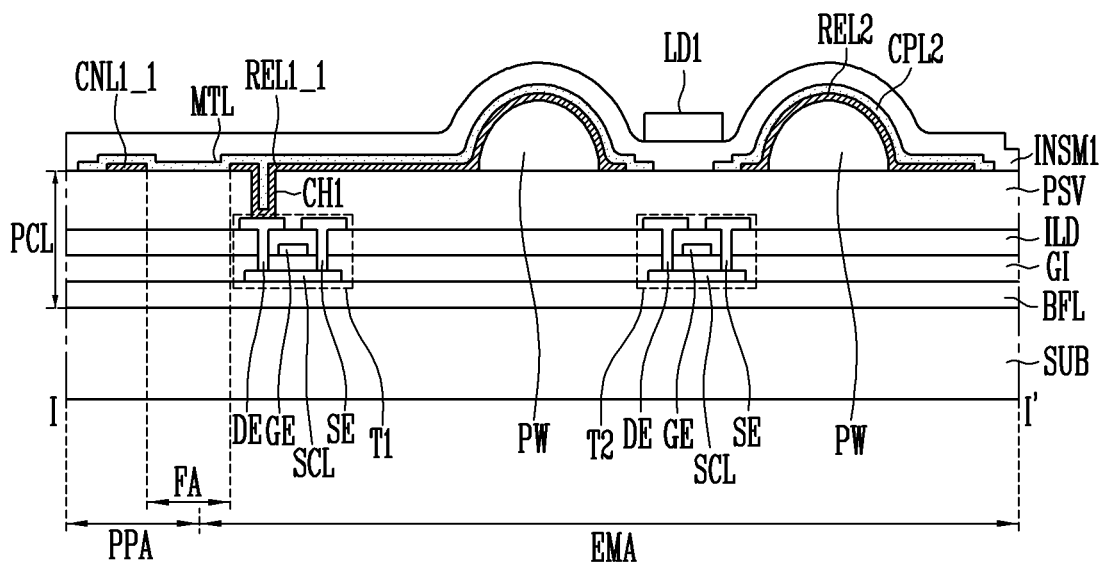
Figure 8F:
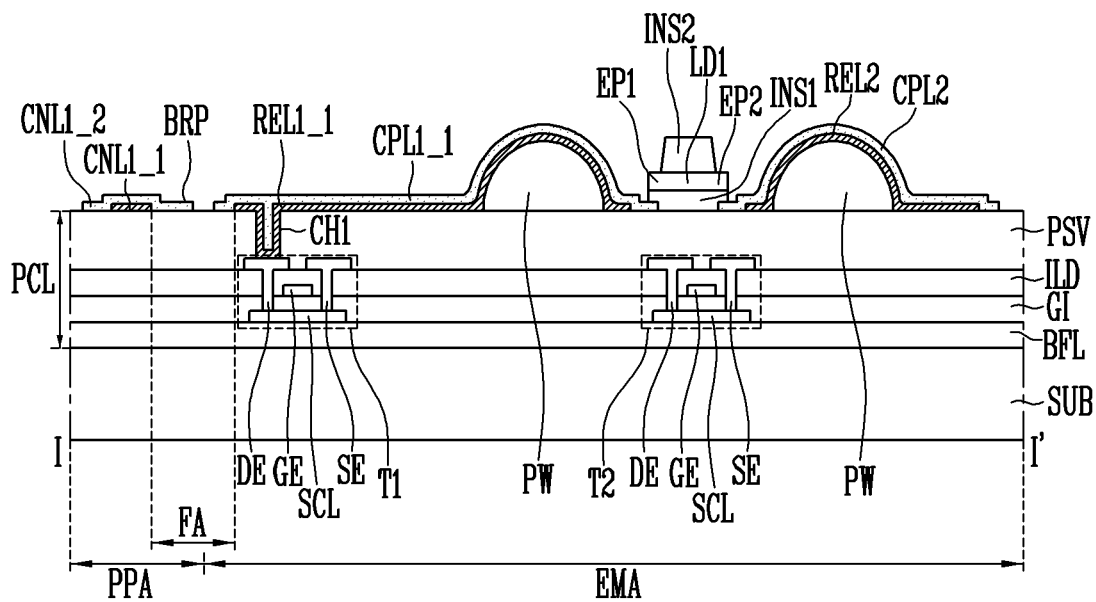
Figure 8G:
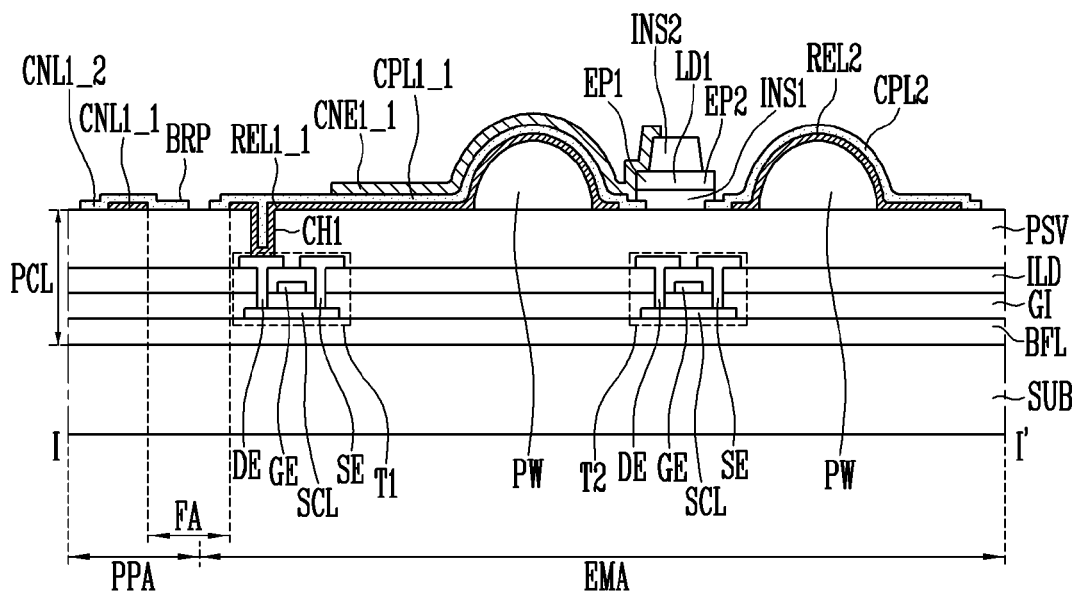
Figure 8H:
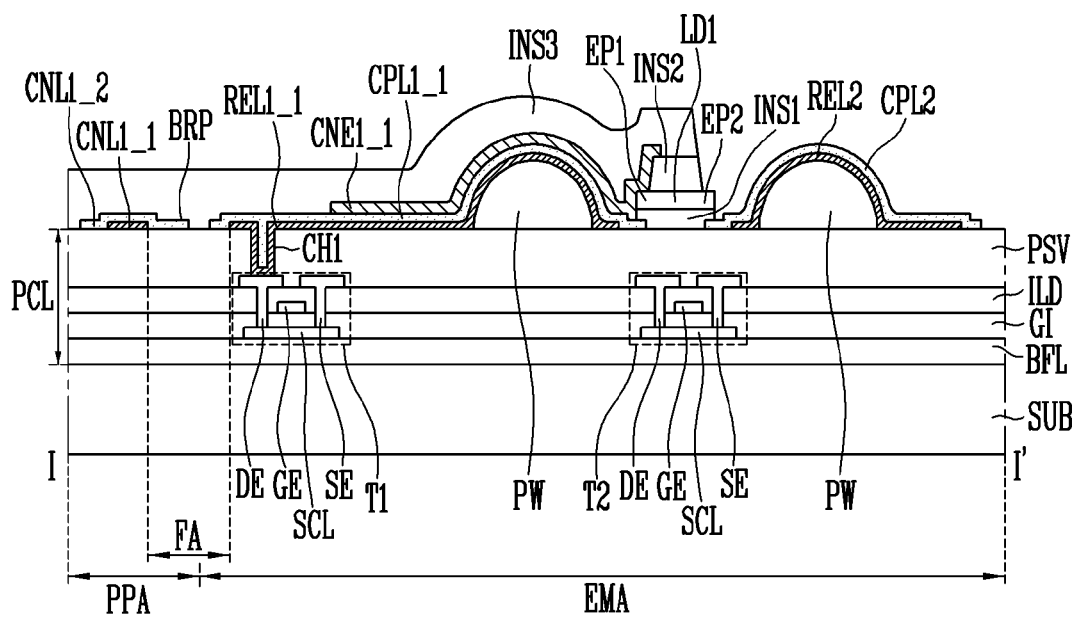
Figure 8I:
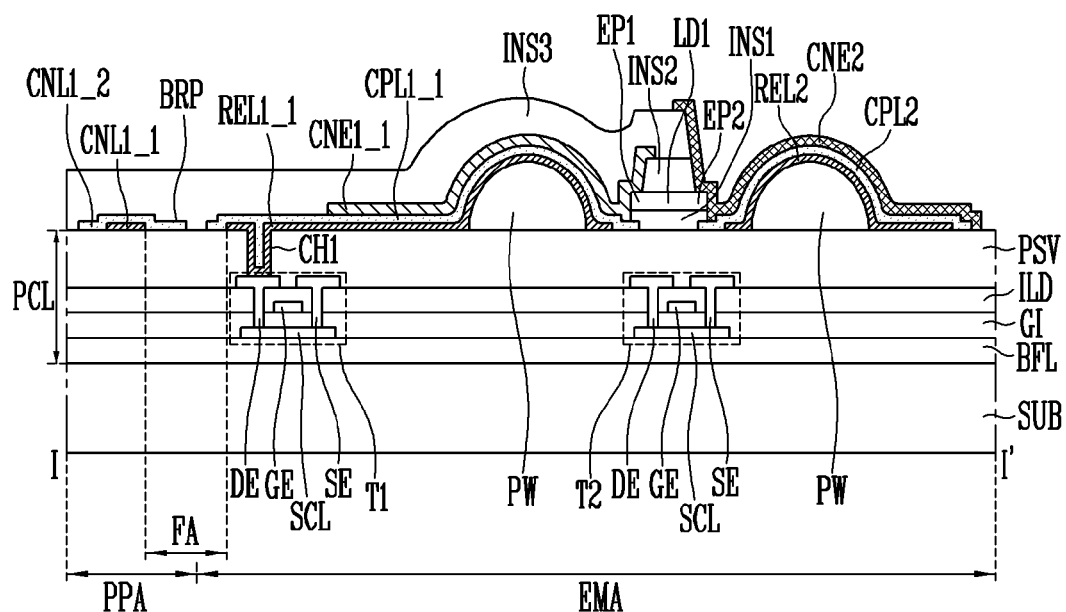
Figure 8J:
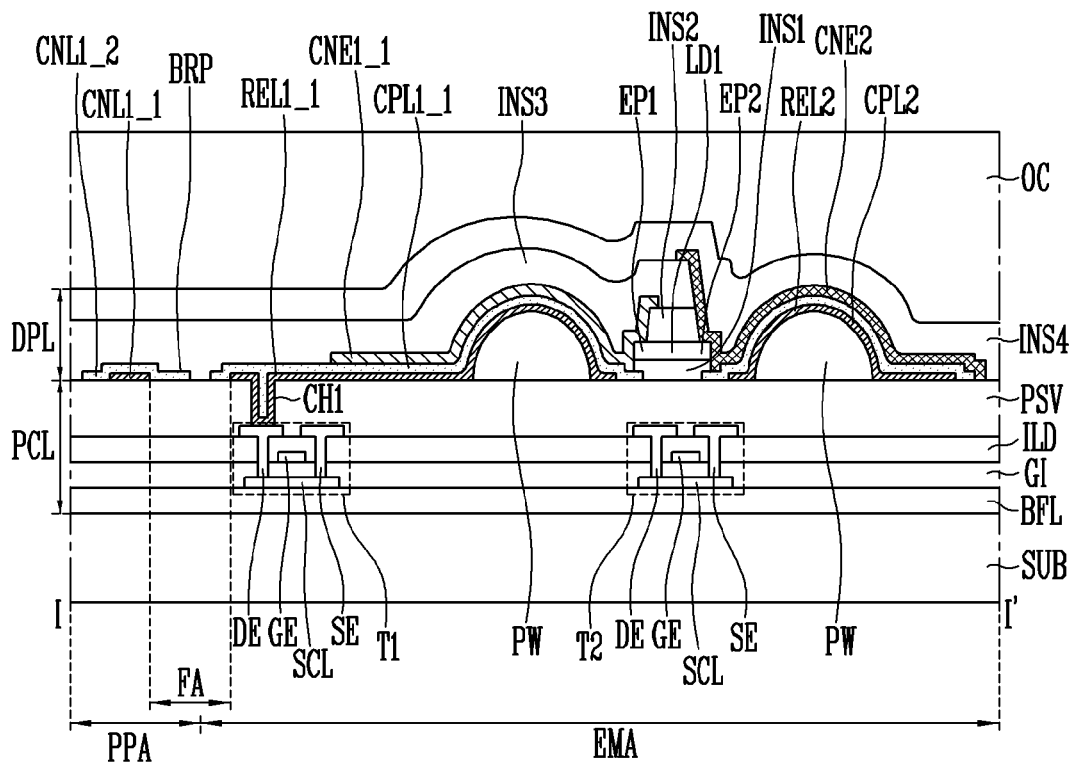

FIG. 4 is a schematic plan view illustrating first to third sub-pixels included in one of pixels illustrated in FIG. 2. FIG. 5A is a cross-sectional view taken along line I-I' of FIG. 4. FIG. 5B is a schematic enlarged cross-sectional view of area EA1 of FIG. 5A. FIG. 6 is a schematic cross-sectional view taken along line of FIG. 4.

In FIG. 4, for the sake of explanation, light emitting elements provided in each sub-pixel are illustrated as being horizontally arranged. However, the arrangement of the light emitting elements is not limited thereto. For example, at least some of the light emitting elements may be arranged in a direction intersecting the horizontal direction.

For the sake of explanation, illustration of transistors connected to the light emitting elements, and signal lines electrically connected to the transistors has been omitted in FIG. 4.

Although FIGS. 4, 5A, 5B, and 6 illustrate a simplified structure of the one pixel, e.g., by showing that each electrode has only a single electrode layer, the disclosure is not limited thereto.

Referring to FIGS. 1A, 2, 4, 5A, 5B, and 6, the display device in accordance with an embodiment of the disclosure may include a substrate SUB on which pixels PXL are provided.

The substrate SUB may include an insulating material such as glass, an organic polymer, or crystal. The substrate SUB may be made of material having flexibility so as to be bendable or foldable and may have a single-layer or multi-layer structure.

For example, the substrate SUB may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material of the substrate SUB may be changed in various ways.

The substrate SUB may include a display area DA and a non-display area NDA.

The pixels PXL may be provided on the display area DA of the substrate SUB, and each may include a first sub-pixel SP1, a second sub-pixel SP2, and a third sub-pixel SP3.

Each of the first to third sub-pixels SP1 to SP3 may include an emission area EMA configured to emit light, and a peripheral area PPA provided around the emission area EMA.

In an embodiment of the disclosure, the emission area EMA may include a pixel area of a corresponding sub-pixel. For example, the emission area EMA of the first sub-pixel SP1 may include a pixel area of the first sub-pixel SP1. The emission area EMA of the second sub-pixel SP2 may include a pixel area of the second sub-pixel SP2. The emission area EMA of the third sub-pixel SP3 may include a pixel area of the third sub-pixel SP3.

In an embodiment of the disclosure, the peripheral area PPA may be a non-emission area which encloses at least one side of the emission area EMA and does not emit the light.

The emission area EMA of each of the first to third sub-pixels SP1 to SP3 may include the substrate SUB, a pixel circuit layer PCL provided on the substrate SUB, and a display element layer DPL provided on the pixel circuit layer PCL.

The pixel circuit layer PCL of each of the first to third sub-pixels SP1 to SP3 may include a buffer layer BFL disposed on the substrate SUB, first and second transistors T1 and T2 disposed on the buffer layer BFL, and a driving voltage line DVL. The pixel circuit layer PCL of each of the first to third sub-pixels SP1 to SP3 may further include a passivation layer PSV which is provided on the first and second transistors T1 and T2 and the driving voltage line DVL.

The display element layer DPL of each of the first to third sub-pixels SP1 to SP3 may include a partition wall (or a bank) PW, first and second electrodes REL1 and REL2, first and second connection lines CNL1 and CNL2, light emitting elements LD, and first and second contact electrodes CNE1 and CNE2 which are provided on the passivation layer PSV.

The first to third sub-pixels SP1 to SP3 may have a substantially identical or similar structure. Hereinafter, for the sake of convenience, the first sub-pixel SP1 of the first to third sub-pixels SP1 to SP3 will be described as a representative example.

The first and second connection lines CNL1 and CNL2 may be provided in the peripheral area PPA of the first sub-pixel SP1.

The partition wall PW, the first and second electrodes REL1 and REL2, the light emitting elements LD, and the first and second contact electrodes CNE1 and CNE2 may be provided in the emission area EMA.

For the sake of convenience, the display element layer DPL of the first sub-pixel SP1 will be described after the pixel circuit layer PCL of the first sub-pixel SP1 is described.

The buffer layer BFL may be provided on the substrate SUB and prevent impurities from diffusing into the first and second transistors T1 and T2. The buffer layer BFL may be provided in a single-layer structure or a multi-layer structure including two or more layers. In the case where the buffer layer BFL has a multi-layer structure, the respective layers may be formed of the same material or different materials. The buffer layer BFL may be omitted depending on the material of the substrate SUB or processing conditions.

The first transistor T1 may be a driving transistor which is electrically connected to some of the light emitting elements LD provided in the display element layer DPL to drive the light emitting element LD. The second transistor T2 may be a switching transistor configured to switch the first transistor T1.

Each of the first and second transistors T1 and T2 may include a semiconductor layer SCL, a gate electrode GE, and source and drain electrodes SE and DE. Although FIGS. 5A and 6 illustrate embodiments in which the first and second transistors T1 and T2 each include the source and drain electrodes SE and DE provided separately from the semiconductor layer SCL, the disclosure is not limited thereto. For example, in an embodiment, in lieu of the structure where at least one transistor disposed in the emission area EMA of the first sub-pixel SP1 includes the source and drain electrodes SE and DE separately provided, the source and drain electrodes SE and DE may be integral with each semiconductor layer SCL.

The semiconductor layer SCL may be disposed on the buffer layer BFL. The semiconductor layer SCL may include a first area which comes into electrical contact with the source electrode SE, and a second area which comes into electrical contact with the drain electrode DE. An area between the first area and the second area may be a channel area.

The semiconductor layer SCL may be a semiconductor pattern formed of polysilicon, amorphous silicon, an oxide semiconductor, etc. The channel area may be an intrinsic semiconductor, which is an undoped semiconductor pattern. Each of the first area and the second area may be a semiconductor pattern doped with impurities.

The gate electrode GE may be provided on the semiconductor layer SCL with a gate insulating layer GI interposed therebetween.

The source electrode SE and the drain electrode DE may respectively come into electrical contact with the first area and the second area of the semiconductor layer SCL through corresponding contact holes that pass through an interlayer insulating layer ILD and the gate insulating layer GI.

The driving voltage line DVL may be provided on the interlayer insulating layer ILD, but it is not limited thereto. In some embodiments, the driving voltage line DVL may be provided on any one of the insulating layers included in the pixel circuit layer PCL. The second driving power supply (VSS of FIG. 3A) may be applied to the driving voltage line DVL.

The passivation layer PSV may include first and second contact holes CH1 and CH2 in which the drain electrode DE of the first transistor T1 is exposed, and a third contact hole CH3 in which the driving voltage line DVL is exposed.

The first connection line CNL1 and the second connection line CNL2 may be provided in the peripheral area PPA of the first sub-pixel SP1 and may extend in a first direction DR1 to the sub-pixels SP2 and SP3 disposed adjacent thereto. In an embodiment of the disclosure, the first connection line CNL1 and the second connection line CNL2 each may be provided in common in the first to third sub-pixels SP1, SP2, and SP3.

The first connection line CNL1 may include a 1-1-th connection line CNL1_1, and a 1-2-th connection line CNL1_2 provided on the 1-1-th connection line CNL1_1. Hence, the first connection line CNL1 may be formed of a double-layer structure for low resistance.

The second connection line CNL2 may include a 2-1-th connection line CNL2_1, and a 2-2-th connection line CNL2_2 provided on the 2-1-th connection line CNL2_1. Hence, the second connection line CNL2 may be formed of a double-layer structure for low resistance in the same manner as that of the first connection line CNL1.

In an embodiment of the disclosure, the 1-1-th connection line CNL1_1 and the 2-1-th connection line CNL2_1 may be provided on the same layer and may include the same material. The 1-2-th connection line CNL1_2 and the 2-2-th connection line CNL2_2 may be provided on the same layer and may include the same material.

The light emitting elements LD are provided in the emission area EMA of the first sub-pixel SP1 and may emit the light.

Each of the light emitting elements LD may include a first conductive semiconductor layer 11, a second conductive semiconductor layer 13, and an active layer 12 interposed between the first and second conductive semiconductor layers 11 and 13. In some embodiments, each of the light emitting elements LD may further include an electrode layer 15 provided on one side of the second conductive semiconductor layer 13.

In an embodiment of the disclosure, each of the light emitting elements LD may be formed of a light emitting diode which is made of material having an inorganic crystal structure and has a subminiature size, e.g., a nanoscale or microscale size.

Each of the light emitting elements LD may include a first end EP1 and a second end EP2. One of the first and second conductive semiconductor layers 11 and 13 may be disposed on the first end EP1, and the other of the first and second conductive semiconductor layers 11 and 13 may be disposed on the second end EP2. In an embodiment of the disclosure, each of the light emitting elements LD may emit any one light of color light and/or white light.

A second insulating layer INS2 for covering (or overlapping) a portion of an upper surface of each of the light emitting elements LD may be provided on the light emitting elements LD. The opposite ends EP1 and EP2 of each of the light emitting elements LD may be exposed to the outside.

A first insulating layer INS1 may be provided under each of the light emitting elements LD. The first insulating layer INS1 may fill in a space between the passivation layer PSV and each of the light emitting elements LD to stably support the light emitting elements LD and prevent the light emitting elements LD from being removed (or derailed) from the passivation layer PSV. The first insulating layer INS1 may be formed of an inorganic insulating layer including inorganic material, or an organic insulating layer including organic material.

The partition wall PW may be provided on the passivation layer PSV in the emission area EMA of the first sub-pixel SP1. Although not illustrated, a pixel defining layer (or a dam layer) formed of the same material as that of the partition wall PW may be formed and/or provided in the peripheral area PPA between adjacent sub-pixels to define the emission area EMA of each sub-pixel.

The partition wall PW may be spaced by a predetermined distance apart from a partition wall PW disposed adjacent thereto on the passivation layer PSV. Two adjacent partition walls PW may be disposed on the passivation layer PSV and spaced apart from each other by a distance equal to or greater than length L of one light emitting element LD.

As illustrated in FIGS. 5A and 6, the partition wall PW may include a curved surface having a cross-sectional shape such as a semicircle, or a semiellipse, a width of which reduces from one surface facing the passivation layer PSV toward an upper end of the partition wall PW, but the disclosure is not limited thereto. In an embodiment, the partition wall PW may have a trapezoidal cross-section, a width of which reduces from the one surface facing the passivation layer PSV toward an upper end or the partition wall PW.

In a cross-sectional view, the shape of each of the partition wall PW is not limited to the foregoing examples, and may be changed in various ways within a range in which the efficiency of light emitted from each of the light emitting elements LD can be enhanced.

The two adjacent partition walls PW may be disposed on the same plane (e.g., on the passivation layer PSV) and have the same height.

Each of the first and second electrodes REL1 and REL2 may be provided in the emission area EMA of the first sub-pixel SP1 and may extend in a second direction DR2 intersecting the first direction DR1. The first and second electrodes REL1 and REL2 may be provided on the same plane and spaced apart from each other by a predetermined distance.

Each of the first and second electrodes REL1 and REL2 may function as an alignment electrode for aligning the light emitting elements LD in the emission area EMA of the first sub-pixel SP1.

Before the light emitting elements LD are aligned in the first sub-pixel SP1, the first electrode REL1 may be electrically connected with the first connection line CNL1. Hence, a first alignment voltage may be applied to the first electrode REL1 through the first connection line CNL1. A second alignment voltage may be applied to the second electrode REL2 through the second connection line CNL2. The first alignment voltage and the second alignment voltage may have different voltage levels. As predetermined alignment voltages having different voltage levels are respectively applied to the first electrode REL1 and the second electrode REL2, an electric field may be formed between the first electrode REL1 and the second electrode REL2. The light emitting elements LD may be aligned on the passivation layer PSV between the first electrode REL1 and the second electrode REL2 by the electric field.

After the light emitting elements LD are aligned in the first sub-pixel SP1, the first electrode REL1 may be spaced apart from the first connection line CNL1 by a predetermined distance. In other words, the first electrode REL1 and the first connection line CNL1 may be electrically and/or physically separated from each other after the alignment of the light emitting elements LD are completed.

The second electrode REL2 may extend in the second direction DR2 and be electrically connected with the 2-1-th connection line CNL2_1. In an embodiment of the disclosure, the second electrode REL2 may diverge from the 2-1-th connection line CNL2_1 in the second direction DR2. Hence, the second electrode REL2 and the 2-1-th connection line CNL2_1 may be integral with each other and electrically and/or physically connected to each other.

The first and second electrodes REL1 and REL2 each may have a bar shape extending in the second direction DR2 in a plan view, but the disclosure is not limited thereto. In an embodiment, the shape of each of the first and second electrodes REL1 and REL2 may be changed in various ways within a range in which an electrical field for aligning the light emitting elements LD in the first sub-pixel SP1 can be formed.

The first electrode REL1 may include a 1-1-th electrode REL1_1 and a 1-2-th electrode REL1_2 which are spaced apart from each other by a predetermined distance with the second electrode REL2 interposed therebetween.

The first contact hole CH1 of the passivation layer PSV may be provided in the emission area EMA of the first sub-pixel SP1 such that the first contact hole CH1 corresponds to a portion of the 1-1-th electrode REL1_1. The second contact hole CH2 of the passivation layer PSV may be provided in the emission area EMA of the first sub-pixel SP1 such that the second contact hole CH2 corresponds to a portion of the 1-2-th electrode REL1_2.

Each of the first and second electrodes REL1 and REL2 may be provided on the partition wall PW. Hence, each of the first and second electrodes REL1 and REL2 may have a shape corresponding to the shape of the partition wall PW.

In the case where the partition wall PW has a semicircular or semielliptical cross-section, each of the first and second electrodes REL1 and REL2 may include a curved portion having a curvature corresponding to the shape of the partition wall PW. In the case where the partition wall PW has a trapezoidal cross-section, each of the first and second electrodes REL1 and REL2 may have an inclined portion corresponding to an inclination of a sidewall of the partition wall PW.

The first and second electrodes REL1 and REL2 may be provided on the passivation layer PSV and may be spaced apart from each other with the light emitting elements LD interposed therebetween.

After the light emitting elements LD are aligned in the emission area EMA of the first sub-pixel SP1, each of the first and second electrodes REL1 and REL2 may function as a driving electrode for driving the light emitting elements LD.

In an embodiment of the disclosure, the first electrode REL1 may be disposed adjacent to one of the opposite ends EP1 and EP2 of each of the light emitting elements LD and may be electrically connected to each of the light emitting elements LD through the first contact electrode CNE1. The second electrode REL2 may be disposed adjacent to the other one of the opposite ends EP1 and EP2 of each of the light emitting elements LD and may be electrically connected to each of the light emitting elements LD through the second contact electrode CNE2.

The first electrode REL1 and the second electrode REL2 may be disposed on the same plane and may have the same height. If the first electrode REL1 and the second electrode REL2 have the same height, each of the light emitting elements LD may be more securely and electrically connected to the first and second electrodes REL1 and REL2.

The first and second electrodes REL1 and REL2 may be made of material having a predetermined reflectivity to allow light emitted from the opposite ends EP1 and EP2 of each of the light emitting elements LD to travel in a direction (e.g., in a frontal direction) in which an image of the display device is displayed.

In an embodiment of the disclosure, the first and second electrodes REL1 and REL2, the 1-1-th connection line CNL1_1, and the 2-1-th connection line CNL2_1 may be provided on the same layer and may be formed of the same material.

The first and second electrodes REL1 and REL2, the 1-1-th connection line CNL1_1, and the 2-1-th connection line CNL2_1 may be formed of conductive material having a predetermined reflectivity. The conductive material may include metal such as Ag, Mg, Al, Pt, Pd, Au, Ni, Nd, Ir, Cr, or an alloy of them, a conductive oxide such as an indium tin oxide (ITO), an indium zinc oxide (IZO), a zinc oxide (ZnO), or an indium tin zinc oxide (ITZO), and a conductive polymer such as PEDOT.

The materials of the first and second electrodes REL1 and REL2, the 1-1-th connection line CNL1_1, and the 2-1-th connection line CNL2_1 are not limited to the foregoing materials.

Each of the first and second electrodes REL1 and REL2, the 1-1-th connection line CNL1_1, and the 2-1-th connection line CNL2_1 may have a single-layer structure, but the disclosure is not limited thereto. For example, it may have a multi-layer structure formed by stacking two or more materials of metals, alloys, conductive oxides, and conductive polymers.

Each of the first and second electrodes REL1 and REL2, the 1-1-th connection line CNL1_1, and the 2-1-th connection line CNL2_1 may have a multilayer structure to minimize a voltage drop due to a signal delay in case that a signal is transmitted to the opposite ends EP1 and EP2 of each of the light emitting elements LD. For example, as illustrated in FIG. 5B, the 1-1-th connection line CNL1_1 may be formed of a multi-layer structure formed by successively stacking first to third conductive layers CL1, CL2, and CL3. In an embodiment of the disclosure, the first conductive layer CL1 may be formed of ITO, the second conductive layer CL2 may be formed of Ag, and the third conductive layer CL3 may be formed of ITO. However, the respective materials of the first to third conductive layers CL1 to CL3 are not limited thereto.

The first and second electrodes REL1 and REL2 and the 2-1-th connection line CNL2_1 each may have a multilayer structure including the first to third conductive layers CL1, CL2, and CL3 in the same manner as that of the 1-1-th connection line CNL1_1.

Since the first and second electrodes REL1 and REL2 have shapes corresponding to the shape of the partition wall PW, light emitted from the opposite ends EP1 and EP2 of each of the light emitting elements LD may be reflected by the first and second electrodes REL1 and REL2, whereby the light may more effectively travel in the frontal direction. Consequently, the efficiency of light emitted from the light emitting elements LD may be enhanced.

In an embodiment of the disclosure, the partition wall PW and the first and second electrodes REL1 and REL2 may function as reflective components enabling light emitted from each of the light emitting elements LD to travel in the frontal direction, thus enhancing the light output efficiency of the light emitting elements LD.

Any one of the first and second electrodes REL1 and REL2 may be an anode electrode, and the other may be a cathode electrode. In an embodiment of the disclosure, the first electrode REL1 may be an anode electrode, and the second electrode REL2 may be a cathode electrode.

The first electrode REL1 may be electrically connected to the drain electrode DE of the first transistor T1 through the contact holes CH1 and CH2 formed in the passivation layer PSV. For example, the 1-1-th electrode REL1_1 may be electrically connected to the drain electrode DE of the first transistor T1 through the first contact hole CH1 of the passivation layer PSV. The 1-2-th electrode REL1_2 may be electrically connected to the drain electrode DE of the first transistor T1 through the second contact hole CH2 of the passivation layer PSV.

The 1-1-th electrode REL1_1 and the 1-2-th electrode REL1_2 provided in the emission area EMA of the first sub-pixel SP1 may be electrically connected to the same transistor, e.g., the drain electrode DE of the first transistor T1.

The second electrode REL2 may be electrically connected to the driving voltage line DVL through the third contact hole CH3 of the passivation layer PSV. Consequently, the second driving power supply VSS of the driving voltage line DVL may be transmitted to the second electrode REL2.

In an embodiment of the disclosure, the light emitting elements LD may include first light emitting elements LD1 aligned between the 1-1-th electrode REL1_1 and the second electrode REL2, and second light emitting elements LD2 aligned between the second electrode REL2 and the 1-2-th electrode REL1_2.

A first end EP1 of each of the first light emitting elements LD1 may be electrically connected to the 1-1-th electrode REL1_1 through the first contact electrode CNE1. Hence, a signal applied to the drain electrode DE of the first transistor T1 may be transmitted to the first end EP1 of each of the first light emitting elements LD1. A second end EP2 of each of the first light emitting elements LD1 may be electrically connected to the second electrode REL2 through the second contact electrode CNE2. Hence, the second driving power supply VSS of the driving voltage line DVL may be transmitted to the second end EP2 of each of the first light emitting elements LD1.

A first end EP1 of each of the second light emitting elements LD2 may be electrically connected to the second electrode REL2 through the second contact electrode CNE2. Hence, the second driving power supply VSS of the driving voltage line DVL may be transmitted to the first end EP1 of each of the second light emitting elements LD2. A second end EP2 of each of the second light emitting elements LD2 may be electrically connected to the 1-2-th electrode REL1_2 through the first contact electrode CNE1. Hence, a signal applied to the drain electrode DE of the first transistor T1 may be transmitted to the second end EP2 of each of the second light emitting elements LD2.

The first and second light emitting elements LD1 and LD2 may form (or constitute) a light source of the first sub-pixel SP1. For example, if driving current flows through the first sub-pixel SP1 during each frame period, the first and second light emitting elements LD1 and LD2 electrically connected to the first and second electrodes REL1 and REL2 of the first sub-pixel SP1 may emit light having a luminance corresponding to the driving current.

The first contact electrode CNE1 may be provided on the first electrode REL1 to electrically and/or physically and securely connect the first electrode REL1 with one end of the opposite ends EP1 and EP2 of each of the light emitting elements LD.

The first contact electrode CNE1 may be formed of transparent conductive material to allow light emitted from each of the light emitting elements LD and/or reflected by the first electrode REL1 to travel in the frontal direction without loss. For example, the transparent conductive material may include ITO, IZO, ITZO, etc. The material of the first contact electrode CNE1 is not limited to the above-mentioned materials.

In a plan view, the first contact electrode CNE1 may cover the first electrode REL1 and overlap the first electrode REL1 The first contact electrode CNE1 may partially overlap one of the opposite ends EP1 and EP2 of each of the light emitting elements LD.

In an embodiment of the disclosure, the first contact electrode CNE1 may include a 1-1-th contact electrode CNE1_1 provided on the 1-1-th electrode REL1_1, and a 1-2-th contact electrode CNE1_2 provided on the 1-2-th electrode REL1_2.

In a plan view, the 1-1-th contact electrode CNE1_1 may overlap the first end EP1 of each of the first light emitting elements LD1 and the 1-1-th electrode REL1_1. In a plan view, the 1-2-th contact electrode CNE1_2 may overlap the second end EP2 of each of the second light emitting elements LD2 and the 1-2-th electrode REL1_2.

A third insulating layer INS3 for covering the first contact electrode CNE1 may be provided on the first contact electrode CNE1. The third insulating layer INS3 may prevent the first contact electrode CNE1 from being exposed to the outside, thus preventing the first contact electrode CNE1 from corroding.

The third insulating layer INS3 may be formed of an inorganic insulating layer including inorganic material, or an organic insulating layer including organic material. Although the third insulating layer INS3 may have a single-layer structure as shown in the drawing, the disclosure is not limited thereto.

The second contact electrode CNE2 may be provided on the second electrode REL2. In a plan view, the second contact electrode CNE2 may cover the second electrode REL2 and overlap the second electrode REL2. The second contact electrode CNE2 may overlap the second end EP2 of each of the first light emitting elements LD1 and the first end EP1 of each of the second light emitting elements LD2.

The second contact electrode CNE2 may be made of the same material as that of the first contact electrode CNE1, but the disclosure is not limited thereto.

A fourth insulating layer INS4 for covering the second contact electrode CNE2 may be provided on the second contact electrode CNE2. The fourth insulating layer INS4 may prevent the second contact electrode CNE2 from being exposed to the outside, thus preventing the second contact electrode CNE2 from corroding. The fourth insulating layer INS4 may be formed of either an inorganic insulating layer or an organic insulating layer.

An overcoat layer OC may be provided on the fourth insulating layer INS4.

The overcoat layer OC may be a planarization layer for mitigating height differences formed in upper surfaces by the partition wall PW, the first and second electrodes REL1 and REL2, the first and second contact electrodes CNE1 and CNE2, etc. that are disposed under the overcoat layer OC.

The overcoat layer OC may be an encapsulation layer for preventing oxygen or water from penetrating into the light emitting elements LD.

In some embodiments, the overcoat layer OC may be omitted. In the case where the overcoat layer OC is omitted, the fourth insulating layer INS4 may function as an encapsulation layer for preventing oxygen or water from penetrating into the light emitting elements LD.

As described above, predetermined voltages may be respectively applied to the opposite ends EP1 and EP2 of each of the first light emitting elements LD1 through the 1-1-th electrode REL1_1 and the second electrode REL2. Hence, each of the first light emitting elements LD1 may emit light by coupling of electron-hole pairs in the active layer 12 of each of the first light emitting elements LD1.

Predetermined voltages may be respectively applied to the opposite ends EP1 and EP2 of each of the second light emitting elements LD2 through the second electrode REL2 and the 1-2-th electrode REL1_2. Hence, each of the second light emitting elements LD2 may emit light by coupling of electron-hole pairs in the active layer 12 of each of the second light emitting elements LD2.

A first capping layer CPL1 and a second capping layer CPL2 may be provided in the emission area EMA of the first sub-pixel SP1.

The first capping layer CPL1 may be provided on the first electrode REL1 The second capping layer CPL2 may be provided on the second electrode REL2. The first and second capping layers CPL1 and CPL2 may prevent corresponding electrodes from being damaged by defects, etc. which may occur during a process of fabricating the display device and may further enhance adhesive force between the corresponding electrodes and the passivation layer PSV.

The first and second capping layers CPL1 and CPL2 may be formed of transparent conductive material made of IZO to minimize loss of light emitted from each of the light emitting elements LD and reflected by the corresponding electrodes in the frontal direction.

Each of the first and second capping layers CPL1 and CPL2 may have a bar shape extending in the second direction DR2 and may overlap the corresponding electrode in a plan view. For example, the first capping layer CPL1 may overlap the first electrode REL1, and the second capping layer CPL2 may overlap the second electrode REL2.

The second capping layer CPL2 may be provided on the same layer as that of the first capping layer CPL1 and may include the same material as that of the first capping layer CPL1. The second capping layer CPL2 may be electrically connected to the 2-2-th connection line CNL2_2 extending in the first direction DR1. The second capping layer CPL2 may be integral with the 2-2-th connection line CNL2_2.

In an embodiment of the disclosure, the first capping layer CPL1 may include a 1-1-th capping layer CPL1_1 and a 1-2-th capping layer CPL1_2. The 1-1-th capping layer CPL1_1 may be provided on the 1-1-th electrode REL1_1. The 1-2-th capping layer CL1_2 may be provided on the 1-2-th electrode REL1_2.

The 1-1-th and 1-2-th capping layers CPL1_1 and CPL1_2, the second capping layer CPL2, the 1-2-th connection line CPL1_2, and the 2-2-th connection line CPL2_2 may be provided on the same layer and may include the same material.

In a plan view, the 1-1-th and 1-2-th capping layers CPL1_1 and CPL1_2 may be spaced apart from the 1-2-th connection line CNL1_2 by a predetermined distance between the emission area EMA of the first sub-pixel SP1 and the peripheral area PPA. Hence, the 1-1-th and 1-2-th capping layers CPL1_1 and CPL1_2 may be electrically and/or physically separated from the 1-2-th connection line CNL1_2.

In an embodiment of the disclosure, before the light emitting elements LD are aligned in the first sub-pixel SP1, a transparent metal layer (not illustrated) formed of the IZO is formed on the first electrode REL1 and the 1-1-th connection line CNL1_1. The transparent metal layer formed of the IZO may be formed on the passivation layer PSV in an area FA (hereinafter, referred to as "first area") provided between the emission area EMA and the peripheral area PPA in the first sub-pixel SP1.

In an embodiment of the disclosure, the first area FA may refer to an area by which the first electrode REL1 and the 1-1-th connection line CNL1_1 are spaced apart from each other in the first sub-pixel SP1, in a plan and/or sectional view.

A transparent metal layer (hereinafter, referred to as "first transparent metal layer") provided on the first electrode REL1, a transparent metal layer (hereinafter, referred to as "second transparent metal layer") provided on the 1-1-th connection line CNL1_1, and a transparent metal layer (hereinafter, referred to as "third transparent metal layer") provided in the first area FA may be integral with each other and electrically and/or physically connected to each other.

If the alignment of the light emitting elements LD in the first sub-pixel SP1 is completed, an etching process may be performed so that a portion of the transparent metal layer provided in the first area FA may be removed. Hence, the first and second transparent metal layer may be electrically and/or physically separated from each other. The first and second transparent metal layers that are electrically and/or physically separated from each other may respectively form the first capping layer CPL1 and the 1-2-th connection line CNL1_2.

In an embodiment of the disclosure, a bridge pattern BRP formed by removing a portion of the transparent metal layer may be provided in the first area FA of the first sub-pixel SP1.

The bridge pattern BRP may be integral with the 1-2-th connection line CNL1_2 and may be electrically and/or physically connected to the 1-2-th connection line CNL1_2. The first connection line CNL1 that extends in the first direction DR1 and has a double-layer structure may be formed by overlapping the 1-2-th connection line CNL1_2 the 1-1-th connection line CNL1_1.

In a plan view, the bridge pattern BRP may have a shape protruding in the second direction DR2 from the 1-2-th connection line CNL1_2 toward the emission area EMA of the first sub-pixel SP1.

The bridge pattern BRP may be disposed in the first area FA of the first sub-pixel SP1 at a position spaced apart from the first electrode REL1 by a predetermined distance. Hence, the bridge pattern BRP and the first electrode REL1 may be electrically and/or physically separated from each other. Consequently, the first electrode REL1 may be electrically and/or physically separated from the first connection line CNL1.

As described above, even though the first connection line CNL1 is provided in common in the first to third sub-pixels SP1 to SP3, the first electrode REL1 provided in each of the first to third sub-pixels SP1 to SP3 is electrically disconnected from the first connection line CNL1 and is electrically connected with the pixel circuit layer PCL in the emission area EMA of the corresponding sub-pixel. Therefore, each of the first to third sub-pixels SP1 to SP3 may be independently driven. Thereby, the display device may be implemented as an active matrix-type display device which independently drives each of the first to third sub-pixels SP1 to SP3.

If, in the same manner as the conventional display device, so as to independently drive each of the first to third sub-pixels SP1 to SP3, the 1-1-th connection line CNL1_1 is divided into parts between sub-pixels disposed adjacent to each other, a portion of the 1-1-th connection line CNL1_1 may be exposed to the outside. In case that the 1-1-th connection line CNL1_1 has a multilayer structure including the first to third conductive layers CL1, CL2, and CL3, an Ag migration phenomenon may be caused by an electrochemical phenomenon if the second conductive layer CL2 is exposed to the outside. An undesired short-circuit of the 1-1-th connection line CNL1_1 may be caused by the Ag migration phenomenon, so that the conventional display device may malfunction.

In an embodiment of the disclosure, the 1-2-th connection line CNL1_2 formed of the IZO may be disposed on the 1-1-th connection line CNL1_1 to cover the 1-1-th connection line CNL1_1. Hence, the second conductive layer CL2 of the 1-1-th connection line CNL1_1 may be prevented from being exposed, whereby the display device may be prevented from malfunctioning.

Each of the first and third conductive layers CL1 and CL3 included in the 1-1-th connection line CNL1_1 may form crystalline ITO during a high-temperature process due to material characteristics of the ITO. In other words, amorphous ITO may be crystallized during the process that is performed at high temperatures, thus forming the crystalline ITO.

If the first and third conductive layers CL1 and CL3 form the crystalline ITO in case that as shown in the conventional display device the 1-1-th connection line CNL1_1 is removed from the sub-pixels disposed adjacent to each other, the first and third conductive layers CL1 and CL3 may remain in the peripheral area PPA of each of the first to third sub-pixels SP1 to SP3 rather than being completely etched. If the first and third conductive layers CL1 and CL3 remain rather than being completely removed, the adjacent sub-pixels may not be electrically disconnected from each other, so that it may be difficult to individually drive each of the first to third sub-pixels SP1 to SP3. Consequently, the conventional display device may not be implemented as an active matrix-type display device.

In an embodiment of the disclosure, using the material characteristics of the IZO that is not crystallized during the high-temperature process, only the transparent metal layer formed of the IZO is disposed in the first area FA of each of the first to third sub-pixels SP1 to SP3, and the 1-2-th connection line CNL1_2, the first capping layer CPL1, and the bridge pattern BRP are formed by removing portions of the transparent metal layer.

FIGS. 7A to 7G are schematic plan views sequentially illustrating a method of fabricating the display device corresponding to FIG. 4. FIGS. 8A to 8J are schematic cross-sectional views sequentially illustrating a method of fabricating the display device corresponding to FIG. 5A.

Referring to FIGS. 1A, 2, 3A, 4, 5A, 5B, 6, 7A, and 8A, respective pixel circuit layers PCL of first to third sub-pixels SP1 to SP3 are formed on a substrate SUB. Each of the first to third sub-pixels SP1 to SP3 may include an emission area EMA and a peripheral area PPA.

The pixel circuit layer PCL may include first and second transistors T1 and T2, a driving voltage line DVL, and a passivation layer PSV.

The passivation layer PSV may include first and second contact holes CH1 and CH2 through which the drain electrode DE of the first transistor T1 is exposed, and a third contact hole CH3 through which a portion of the driving voltage line DVL is exposed.

Referring to FIGS. 1A, 2, 3A, 4, 5A, 5B, 6, 8A, and 8B, a partition wall PW is formed on the passivation layer PSV in the emission area EMA of each of the first to third sub-pixels SP1 to SP3.

The partition wall PW may be spaced by a predetermined distance apart from a partition wall PW disposed adjacent thereto on the passivation layer PSV. The partition wall PW may include an inorganic insulating layer formed of inorganic material or an organic insulating layer formed of organic material. In an embodiment, the partition wall PW may include a single organic insulating layer and/or a single inorganic insulating layer, but the disclosure is not limited thereto. For example, the partition wall PW may have a multi-layer structure formed by stacking organic insulating layers and inorganic insulating layers.

The partition wall PW may include a curved surface having a cross-sectional shape such as a semicircle, or a semiellipse, a width of which reduces from one surface facing the passivation layer PSV toward an upper end of the partition wall PW, but the disclosure is not limited thereto. In an embodiment, each of the partition walls PW may have various shapes within a range in which the efficiency of light emitted from each of the light emitting elements LD can be enhanced. For example, the shape, size, and/or arrangement structure of the partition wall PW may be changed in various ways depending on embodiments.

Referring to FIGS. 1A, 2, 3A, 4, 5A, 5B, 6, 7B, and 8A to 8C, 1-1-th and 2-1-th connection lines CNL1-1 and CNL2-1, and first and second electrodes REL1 and REL2 are formed on the passivation layer PSV including the partition wall PW.

The 1-1-th and 2-1-th connection lines CNL1_1 and CNL2-1 and the first and second electrodes REL1 and REL2 may include the same material and may have a multilayer structure. For example, the 1-1-th and 2-1-th connection lines CNL1_1 and CNL2_1 and the first and second electrodes REL1 and REL2 each may have a multi-layer structure formed by successively stacking a first conductive layer CL1 formed of ITO, a second conductive layer CL2 formed of Ag, and a third conductive layer CL3 formed of the ITO.

The first electrode REL1 and the second electrode REL2 are provided in the emission area EMA of each of the first to third sub-pixels SP1 to SP3. The 1-1-th and 2-1-th connection lines CNL1_1 and CNL1_2 are provided in the peripheral area PPA of each of the first to third sub-pixels SP1 to SP3.

The first electrode REL1 may extend in the second direction DR2 and be electrically and/or physically separated from the 1-1-th connection line CNL1_1.

The second electrode REL2 may extend from the 2-1-th connection line CNL2 in the second direction DR2. The 2-1-th connection line CNL2 and the second electrode REL2 may be integral with each other and electrically and/or physically connected to each other.

Each of the first and second electrodes REL1 and REL2 may be formed on the partition wall PW.

The first electrode REL1 may include a 1-1-th electrode REL1_1 and a 1-2-th electrode REL1_2. The 1-1-th electrode REL1_1, the 1-2-th electrode REL1_2, and the second electrode REL2 may be disposed on the same plane at positions spaced apart from each other by a predetermined distance.

In an embodiment of the disclosure, each of the 1-1-th and 2-1-th connection lines CNL1_1 and CNL2_1 may extend in a first direction DR1 intersecting the second direction DR2 and may be provided in common in the first to third sub-pixels SP1 to SP3.

Referring to FIGS. 1A, 2, 3A, 4, 5A, 5B, 6, 7C, and 8A to 8D, a second capping layer CPL2, a metal layer MTL, and a 2-2-th connection line CNL2_2 are formed on the passivation layer PSV on which the first and second electrodes REL1 and REL2, etc. are provided.

The second capping layer CPL2, the metal layer MTL, and the 2-2-th connection line CNL2_2 may include the same material. For example, the second capping layer CPL2, the metal layer MTL, and the 2-2-th connection line CNL2_2 may have transparent conductive material formed of IZO.

The second capping layer CPL2 may be provided on the second electrode REL2 in the emission area EMA of each of the first to third sub-pixels SP1 to SP3, and electrically connected with the second electrode REL2.

In an embodiment of the disclosure, the second capping layer CPL2 may be integral with the 2-2-th connection line CNL2_2, and electrically and physically connected with the 2-2-th connection line CNL2_2.

The 2-2-th connection line CNL2_2 may extend in the first direction DR1 in the respective peripheral areas PPA of the first to third sub-pixels SP1 to SP3, may be formed on the 2-1-th connection line CNL2_1, and may overlap the 2-1-th connection line CNL2_1. In an embodiment of the disclosure, the 2-1-th connection line CNL2_1 and the 2-2-th connection line CNL2_2 that are successively stacked may form a second connection line CNL2 having a double-layer structure.

The metal layer MTL may be provided on the first electrode REL1 in the respective emission areas EMA of the first to third sub-pixels SP1 to SP3 and may be provided on the 1-1-th connection line CNL1_1 in the respective peripheral area PPA of the first to third sub-pixels SP1 to SP3. The metal layer MTL may be provided on the passivation layer PSV of the first area FA disposed between the emission area EMA and the peripheral area PPA in each of the first to third sub-pixels SP1 to SP3.

In the following embodiments, for the sake of convenience, the metal layer MTL provided in the emission area EMA of each of the first to third sub-pixels SP1 to SP3 will be referred to as a first metal layer MTL, the metal layer MTL provided in the peripheral area PPA of each of the first to third sub-pixels SP1 to SP3 will be referred to as a second metal layer MTL, and the metal layer MTL provided in the first area FA will be referred to as a third metal layer MTL.

The first metal layer MTL may be provided on the first electrode REL1 and electrically connected to the first electrode REL1 The second metal layer MTL may be provided on the 1-1-th connection line CNL1_1 and electrically connected to the 1-1-th connection line CNL1_1.

In an embodiment of the disclosure, the first metal layer MTL, the second metal layer MTL, and the third metal layer MTL may be integral with each other and electrically and/or physically connected to each other. Hence, the 1-1-th connection line CNL1_1 and the first electrode REL1 may be electrically connected to each other.

A portion of the third metal layer MTL may be removed after the alignment of the light emitting elements LD in the first to third sub-pixels SP1 to SP3 is completed. Detailed description of this process will be made with reference to FIG. 7E.

Referring to FIGS. 1A, 2, 3A, 4, 5A, 5B, 6, 7D, and 8A to 8E, a first insulating material layer INSM1 is formed on the passivation layer PSV on which the second capping layer CPL2, etc. are provided. The first insulating material layer INSM1 may be formed of an inorganic insulating layer including inorganic material, or an organic insulating layer including organic material.

Thereafter, an electric field is formed between the first electrode REL1 and the second electrode REL2 by respectively applying corresponding alignment voltages to the first and second electrodes REL1 and REL2 through the 1-1-th connection line CNL1_1 and the 2-1-th connection line CNL2_1.

In the case where alternating current power or direct current power having predetermined voltage and period is repeatedly applied several times to each of the first and second electrodes REL1 and REL2 through the 1-1-th and 2-1-th connection lines CNL1_1 and CNL2_1, an electric field may be formed between the first and second electrodes REL1 and REL2 by a difference in potential between the first and second electrodes REL1 and REL2.

While the electric field is formed between the first electrode REL1 and the second electrode REL2, the light emitting elements LD are supplied onto the passivation layer PSV by an inkjet printing method or the like. For example, the light emitting elements LD may be supplied onto the passivation layer PSV in the emission area EMA of each of the first to third sub-pixels SP1 to SP3 by disposing a nozzle over the passivation layer PSV and dropping a solvent including the light emitting elements LD onto the passivation layer PSV through the nozzle. The solvent may be any one of acetone, water, alcohol, and toluene, but the disclosure is not limited thereto. For example, the solvent may include material which may be vaporized at the room temperature or by heat. The solvent may have the form of ink or paste.

A method of supplying the light emitting elements LD is not limited to the foregoing method. The method of supplying the light emitting elements LD may be changed. Subsequently, the solvent may be removed.

If the light emitting elements LD are supplied onto the passivation layer PSV, self-alignment of the light emitting elements LD may be induced by the electric field formed between the first electrode REL1 and the second electrode REL2. Hence, the light emitting elements LD may be aligned between the first electrode REL1 and the second electrode REL2.

In an embodiment of the disclosure, each of the light emitting elements LD may be aligned on the first insulating material layer INSM1 between the first electrode REL1 and the second electrode REL2.

Referring to FIGS. 1A, 2, 3A, 4, 5A, 5B, 6, 7E, and 8A to 8F, after the alignment of the light emitting elements LD is completed, a first capping layer CPL1, a 1-2-th connection line CNL1_2, and a bridge pattern BRP are formed by removing a portion of the third metal layer MTL in each of the first to third sub-pixels SP1 to SP3.

The first capping layer CPL1 may be provided in the emission area EMA of each of the first to third sub-pixels SP1 to SP3, the 1-2-th connection line CNL1_2 may be provided in the peripheral area PPA of each of the first to the third sub-pixels SP1 to SP3, and the bridge pattern BRP may be provided in the first area FA of each of the first to third sub-pixels SP1 to SP3.

The first capping layer CPL1 may be provided on the first electrode REL1, cover the first electrode REL1, and may be electrically connected to the first electrode REL1.

The 1-2-th connection line CNL1_2 may extend in the first direction DR1 and be provided in common to the first to third sub-pixels SP1 to SP3. The 1-2-th connection line CNL1_2 may be provided on the 1-1-th connection line CNL1_1 and may overlap the 1-1-th connection line CNL1_1. As a result, a first connection line CNL1 having a double-layer structure in which the 1-1-th connection line CNL1_1 and the 1-2-th connection line CNL1_2 are sequentially stacked may be formed. The first connection line CNL1 may be provided in common to the first to third sub-pixels SP1 to SP3.

The bridge pattern BRP may be formed by removing a portion of the third metal layer MTL from the first area FA of each of the first to the third sub-pixels SP1 to SP3.

The bridge pattern BRP may be integral with the 1-2-th connection line CNL1_2, and electrically and/or physically connected to the 1-2-th connection line CNL1_2. In a plan view, the bridge pattern BRP may protrude in the second direction DR2 from the 1-2-th connection line CNL1_2 toward the emission area EMA of each of the first to third sub-pixels SP1 to SP3.

The bridge pattern BRP may be electrically and/or physically separated from the first electrode REL1 of each of the first to third sub-pixels SP1 to SP3. Hence, the first connection line CNL1 provided in common in the first to third sub-pixels SP1 to SP3 may be electrically disconnected from the first electrode REL1 provided in each of the first to third sub-pixels SP1 to SP3.

Consequently, each of the first to third sub-pixels SP1 to SP3 may be electrically and/or physically separated from each other and thus individually driven.

After a second insulating material layer (not illustrated) is formed on the passivation layer PSV on which the first connection line CNL1, etc. are provided, a second insulating layer INS2 may be formed in the emission area EMA of each of the first to third sub-pixels SP1 to SP3 by patterning the second insulating material layer using a mask.

The second insulating layer INS2 may allow the opposite ends EP1 and EP2 of the light emitting elements LD to be exposed in the emission area EMA of each of the first to third pixels SP1 to SP3.

The second insulating layer INS2 may be formed of an inorganic insulating layer including inorganic material, or an organic insulating layer including organic material. The second insulating layer INS2 may have a single-layer structure and may also have a multi-layer structure. In the case where the second insulating layer INS2 has a multilayer structure, the second insulating layer INS2 may have a structure in which inorganic insulating layers and organic insulating layers are sequentially stacked.

The first insulating material layer INSM1 may also be patterned by the foregoing mask process so that a first insulating layer INS1 can be formed in the emission area EMA of each of the first to third pixels SP1 to SP3.

In an embodiment, the first and second insulating layers INS1 and INS2 may be patterned and formed together through the mask process of forming a third insulating layer INS3 to be described below.

Referring to FIGS. 1A, 2, 3A, 4, 5A, 5B, 6, 7F, and 8A to 8G, a first contact electrode CNE1 is formed in the emission area EMA of each of the first to third sub-pixels SP1 to SP3 on the passivation layer PSV including the second insulating layer INS2.

The first contact electrode CNE1 may be formed on the first electrode REL1 and electrically connected with the first electrode REL1 The first contact electrode CNE1 may be formed on one end of the opposite ends EP1 and EP2 of each of the light emitting elements LD and electrically connected with the one end of each of the light emitting elements LD.

Therefore, the first electrode REL1 and the one end of each of the light emitting elements LD may be electrically connected with each other through the first contact electrode CNE1.

Referring to FIGS. 1A, 2, 3A, 4, 5A, 5B, 6, and 8A to 8H, after a third insulating material layer (not illustrated) is deposited on the passivation layer PSV on which the first contact electrode CNE1 is provided, the third insulating layer INS3 for covering the first contact electrode CNE1 is formed using a mask process.

Here, the first contact electrode CNE1 may not be exposed to the outside by the third insulating layer INS3. The second electrode REL2 and the other end of the opposite ends EP1 and EP2 of each of the light emitting elements LD may be exposed to the outside.

Referring to FIGS. 1A, 2, 3A, 4, 5A, 5B, 6, 7G, and 8A to 8I, a second contact electrode CNE2 is formed in the emission area EMA of each of the first to third sub-pixels SP1 to SP3 on the passivation layer PSV on which the third insulating layer INS3 is formed.

The second contact electrode CNE2 may be formed on the exposed second electrode REL2 and electrically connected with the second electrode REL2. The second contact electrode CNE2 may be formed on the other exposed end of each of the light emitting elements LD and electrically connected with the other end of each of the light emitting elements LD.

Therefore, the second electrode REL2 and the other end of each of the light emitting elements LD may be electrically connected with each other through the second contact electrode CNE2.

Referring to FIGS. 1A, 2, 3A, 4, 5A, 5B, 6, and 8A to 8J, a fourth insulating layer INS4 is formed on the overall surface of the passivation layer PSV including the second contact electrode CNE2.

The fourth insulating layer INS4 may be formed of an inorganic insulating layer including inorganic material, or an organic insulating layer including organic material. Although the fourth insulating layer INS4 may have a single layer structure as shown in the drawing, the disclosure is not limited thereto. For example, the fourth insulating layer INS4 may have a multi-layer structure.

Subsequently, an overcoat layer OC is formed on the fourth insulating layer INS4.

Figure 9A:
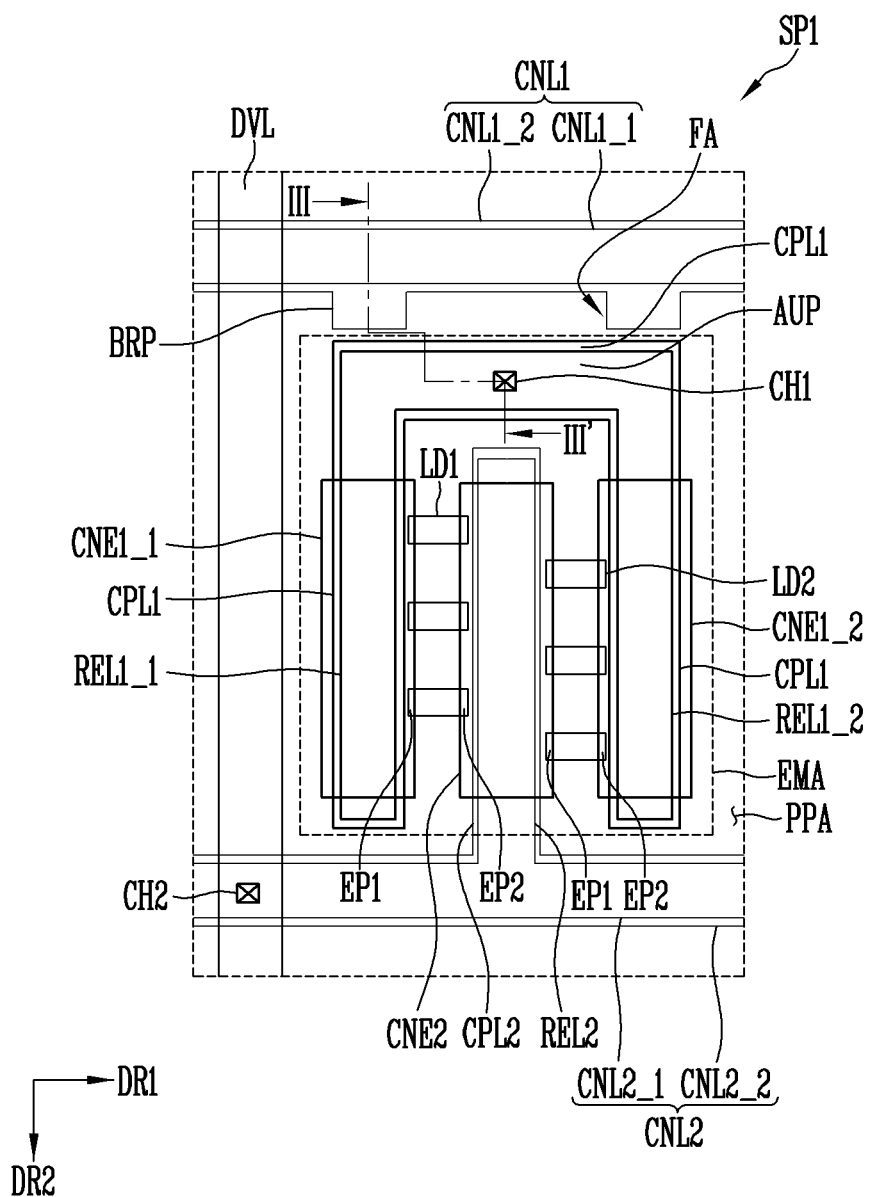
FIGS. 9A and 9B are schematic plan views illustrating another embodiment of a first sub-pixel of FIG. 4.
Figure 9B:
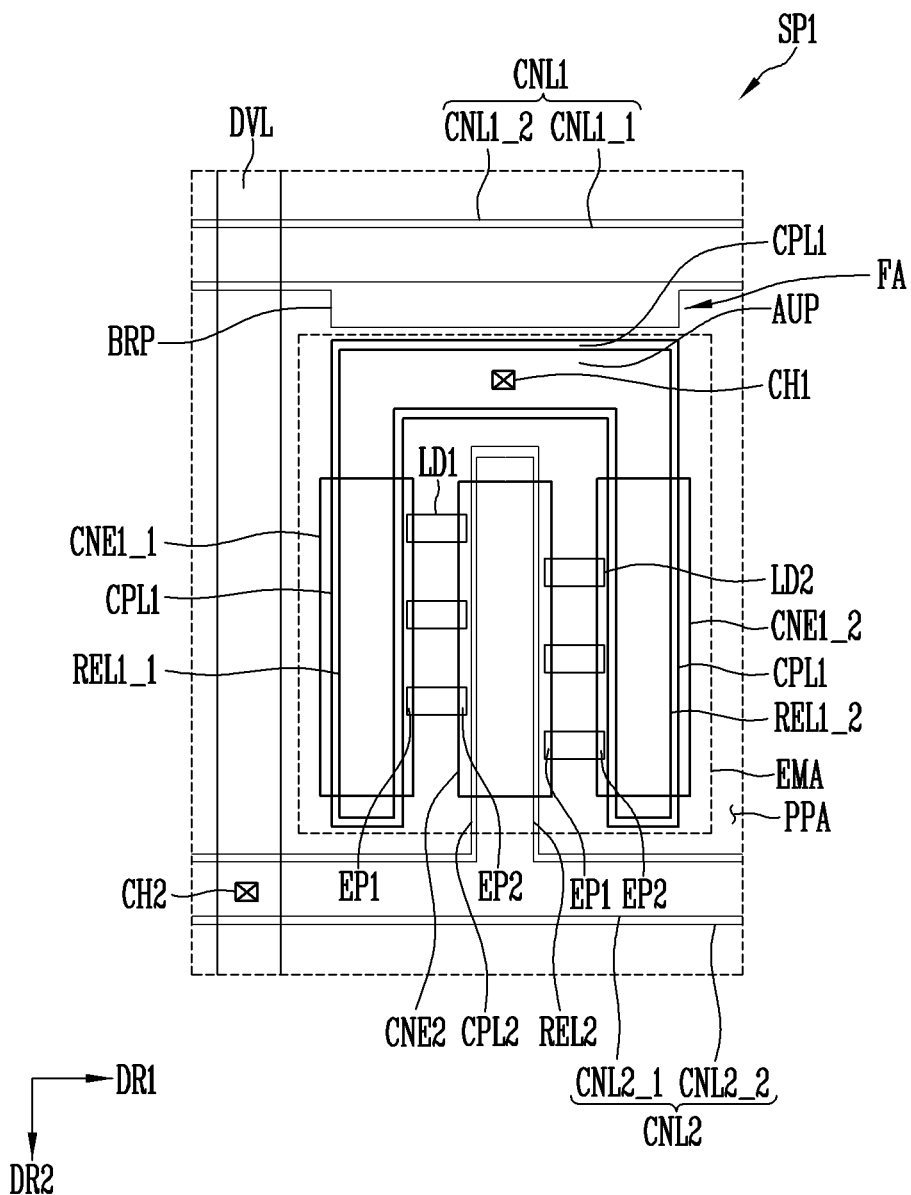
Figure 10:
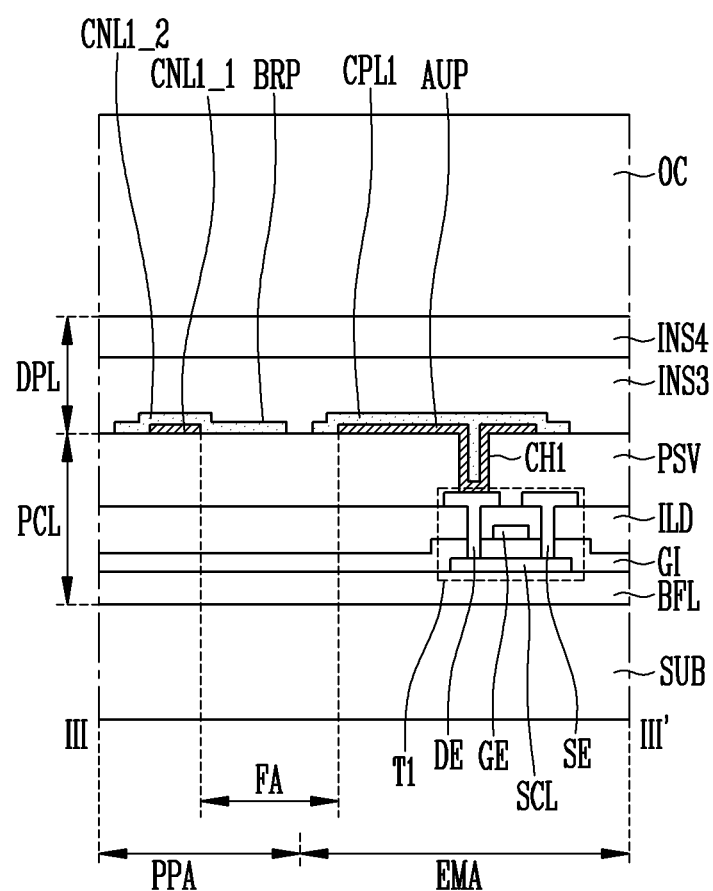
FIG. 10 is a schematic cross-sectional view taken along line III-III' of FIG. 9A.

FIGS. 9A and 9B are schematic plan views illustrating another embodiment of the first sub-pixel of FIG. 4. FIG. 10 is a schematic cross-sectional view taken along line of FIG. 9A.

A first sub-pixel illustrated in FIG. 9A, other than the fact that a 1-1-th electrode and a 1-2-th electrode are electrically connected to an auxiliary pattern and the auxiliary pattern is electrically connected with a pixel circuit layer through a first contact hole, may have a configuration substantially identical or similar to that of the first sub-pixel of FIG. 4.

A first sub-pixel illustrated in FIG. 9B, other than the fact that a width of a bridge electrode is greater than that of a bridge electrode provided in the first sub-pixel of FIG. 9A, may have a configuration substantially identical or similar to that of the first sub-pixel of FIG. 9A.

Therefore, to avoid redundant explanation, the description of the first sub-pixel of FIGS. 9A, 9B, and 10 will be focused on differences from the foregoing embodiments. Components which are not separately explained in the following description of the embodiment comply with that of the foregoing embodiments. The same reference numeral will be used to designate the same component, and a similar reference numeral will be used to designate a similar component.

Although for the sake of convenience FIGS. 9A and 9B illustrate that light emitting elements provided in the first sub-pixel are aligned in a horizontal direction, the alignment of the light emitting elements is not limited thereto. For example, at least some of the light emitting elements may be arranged in a direction intersecting the horizontal direction.

For the sake of explanation, illustration of transistors electrically connected to the light emitting elements, and signal lines electrically connected to the transistors has been omitted in FIGS. 9A and 9B.

Although FIGS. 9A, 9B, and 10 illustrate a simplified structure of the first sub-pixel, e.g., by showing that each electrode has only a single electrode layer, the disclosure is not limited thereto.

Referring to FIGS. 1A, 4, 9A, 9B, and 10, the first sub-pixel SP1 may include a substrate SUB, a pixel circuit layer PCL provided on the substrate SUB, and a display element layer DPL provided on the pixel circuit layer PCL.

The pixel circuit layer PCL may further include first and second transistors T1 and T2, a driving voltage line DVL, and a passivation layer PSV which are provided over the substrate SUB.

The display element layer DPL may include light emitting elements LD, first and second connection lines CNL1 and CNL2, a partition wall PW, first and second electrodes REL1 and REL2, first and second capping layers CPL1 and CPL2, first and second contact electrodes CNE1 and CNE2, and a bridge pattern BRP which are provided on the pixel circuit layer PCL.

In an embodiment of the disclosure, the first sub-pixel SP1 may include an emission area EMA configured to emit light, and a peripheral area PPA provided around the emission area EMA. The emission area EMA may include a pixel area of the first sub-pixel SP1. The peripheral area PPA may include a non-emission area which encloses at least one side of the emission area EMA and does not emit the light.

Some components of the pixel circuit layer PCL and some components of the display element layer DPL may be formed and/or provided in the emission area EMA of the first sub-pixel SP1. For example, the first and second transistors T1 and T2 may be provided in the emission area EMA. The light emitting elements LD, the first and second electrodes REL1 and REL2, the first and second capping layers CPL1 and CPL2, and the first and second contact electrodes CNE1 and CNE2 may be provided in the peripheral area PPA. However, the disclosure is not limited to the foregoing description. In an embodiment, the other components of the pixel circuit layer PCL and the other components of the display element layer DPL may be formed and/or provided in the emission area EMA.

The other components of the pixel circuit layer PCL and the other components of the display element layer DPL may be formed and/or provided in the peripheral area PPA of the first sub-pixel SP1. For example, the driving voltage line DVL may be provided in the peripheral area PPA. The first and second connection lines CNL1 and CNL2 may be provided in the peripheral area PPA. However, the disclosure is not limited to the foregoing structure. In an embodiment, the components of the pixel circuit layer PCL except the driving voltage line DVL and the components of the display element layer DPL except the first and second connection lines CNL1 and CNL2 may also be formed and/or provided in the peripheral area PPA.

The first connection line CNL1 may include a 1-1-th connection line CNL1_1 extending in the first direction DR1 in the peripheral area PPA, and a 1-2-th connection line CNL1_2 provided on the 1-1-th connection line CNL1_1. The 1-1-th connection line CNL1_1 and the 1-2-th connection line CNL1_2 may be provided in common not only in the first sub-pixel SP1 but also in sub-pixels adjacent to the first sub-pixel SP1, e.g., in second and third sub-pixels SP2 and SP3.

The second connection line CNL2 may include a 2-1-th connection line CNL2_1 extending in the first direction DR1 in the peripheral area, and a 2-2-th connection line CNL2_2 provided on the 2-1-th connection line CNL2_1. The 2-1-th connection line CNL2_1 may be electrically and/or physically connected with the second electrode REL1.

In an embodiment of the disclosure, the first electrode REL1 may include a 1-1-th electrode REL1_1 and a 1-2-th electrode REL1_2 which are spaced apart from each other by a predetermined distance with the second electrode REL2 interposed therebetween. The 1-1-th and 1-2-th electrodes REL1_1 and REL1_2 may be spaced apart from the first connection line CNL1 by a predetermined distance, and electrically and/or physically separated from the first connection line CNL1.

The 1-1-th electrode REL1_1 and the 1-2-th electrode REL1-2 may be electrically and/or physically connected to each other through an auxiliary pattern AUP. The auxiliary pattern AUP may extend in the first direction DR1 in the emission area EMA.

The auxiliary pattern AUP may be electrically connected to each of one end of the 1-1-th electrode REL1_1 and one end of the 1-2-th electrode REL1_2 and may be integral with the 1-1-th and 1-2-th electrode REL1_1 and REL1_2. Hence, the auxiliary pattern AUP, and the 1-1-th and 1-2-th electrodes REL1_1 and REL1_2 may be provided on the same plane and may include the same material.

The auxiliary pattern AUP may be electrically connected to the first transistor T1 of the pixel circuit layer PCL through the first contact hole CH1 of the passivation layer PSV. The first contact hole CH1 may be a via hole that passes through the passivation layer PSV to expose the drain electrode DE of the first transistor T1. Since the auxiliary pattern AUP is electrically connected to the first transistor T1, a signal applied to the first transistor T1 may be transmitted to the 1-1-th and 1-2-th electrodes REL1_1 and REL1_2.

The second electrode REL2 may be electrically connected to the driving voltage line DVL through the second contact hole CH2 of the passivation layer PSV. The second contact hole CH2 may be a via hole which passes through the passivation layer PSV to expose the driving voltage line DVL. Consequently, the second driving power supply (refer to VSS of FIG. 3A) applied to the driving voltage line DVL may be transmitted to the second electrode REL2.

The same first capping layer CPL1 may be provided on the 1-1-th and 1-2-th electrodes REL1_1 and REL1_2 and the auxiliary pattern AUP. The second capping layer CPL2 may be provided on the second electrode REL2.

The first capping layer CPL1, the second capping layer CPL2, and the 1-2-th connection line CNL1_2, and the 2-2-th connection line CNL2_2 may be provided on the same plane and include the same material.

The first sub-pixel SP1 may include a first area FA disposed between the emission area EMA and the peripheral area PPA. In a plan and/or sectional view, the first area FA may refer to an area by which the first electrode REL1 and the 1-1-th connection line CNL1_1 are spaced apart from each other. A bridge pattern BRP may be provided in the first area FA.

The bridge pattern BRP may be integral with the 1-2-th connection line CNL1_2 and may be electrically and/or physically connected to the 1-2-th connection line CNL1_2. The bridge pattern BRP and the 1-2-th connection line CNL1_2 may be provided on the same plane and may include the same material.

In a plan view, the bridge pattern BRP may have a shape protruding in the second direction DR2 from the 1-2-th connection line CNL1_2 toward the emission area EMA of the first sub-pixel SP1.

A width of the bridge pattern BRP with respect to a horizontal direction (e.g., the first direction DR1) may be the same as a horizontal width of the first capping layer CPL1 provided on the 1-1-th electrode REL1_1 or the 1-2-th electrode REL1_2, as illustrated in FIG. 9A, but the disclosure is not limited thereto. In an embodiment, as illustrated in FIG. 9B, the bridge pattern BRP may have the same width as the horizontal width of the first capping layer CPL1 provided on the auxiliary pattern AUP. In this case, the bridge pattern BRP may have a rectangular shape including a horizontal side which is long in the first direction DR1, and a vertical side which is short in a second direction DR2 intersecting the first direction DR1.

For example, the shape, size, and/or arrangement structure of the bridge pattern BRP may be changed in various ways depending on embodiments.

The bridge pattern BRP may be disposed in the first area FA of the first sub-pixel SP1 at a position spaced apart from the first electrode REL1 by a predetermined distance. Hence, the bridge pattern BRP and the first electrode REL1 may be electrically and/or physically separated from each other. Consequently, the first electrode REL1 may be electrically and/or physically separated from the first connection line CNL1.

Even if the first connection line CNL1 is provided in common not only in the first sub-pixel SP1 but also in the second and third sub-pixels SP2 and SP3, the first electrode REL1 provided in the first sub-pixel SP1 is electrically disconnected from the first connection line CNL1. Hence, the first sub-pixel SP1 may be driven independently from the second and third sub-pixels SP2 and SP3. Since the first electrode REL1 provided in the first sub-pixel SP1 is electrically connected to a corresponding pixel circuit layer PCL through the first contact hole CH1 in the emission area EMA of the first sub-pixel SP1, the first sub-pixel SP1 may be driven independently and separately from the second and third sub-pixels SP2 and SP3.

Figure 11:
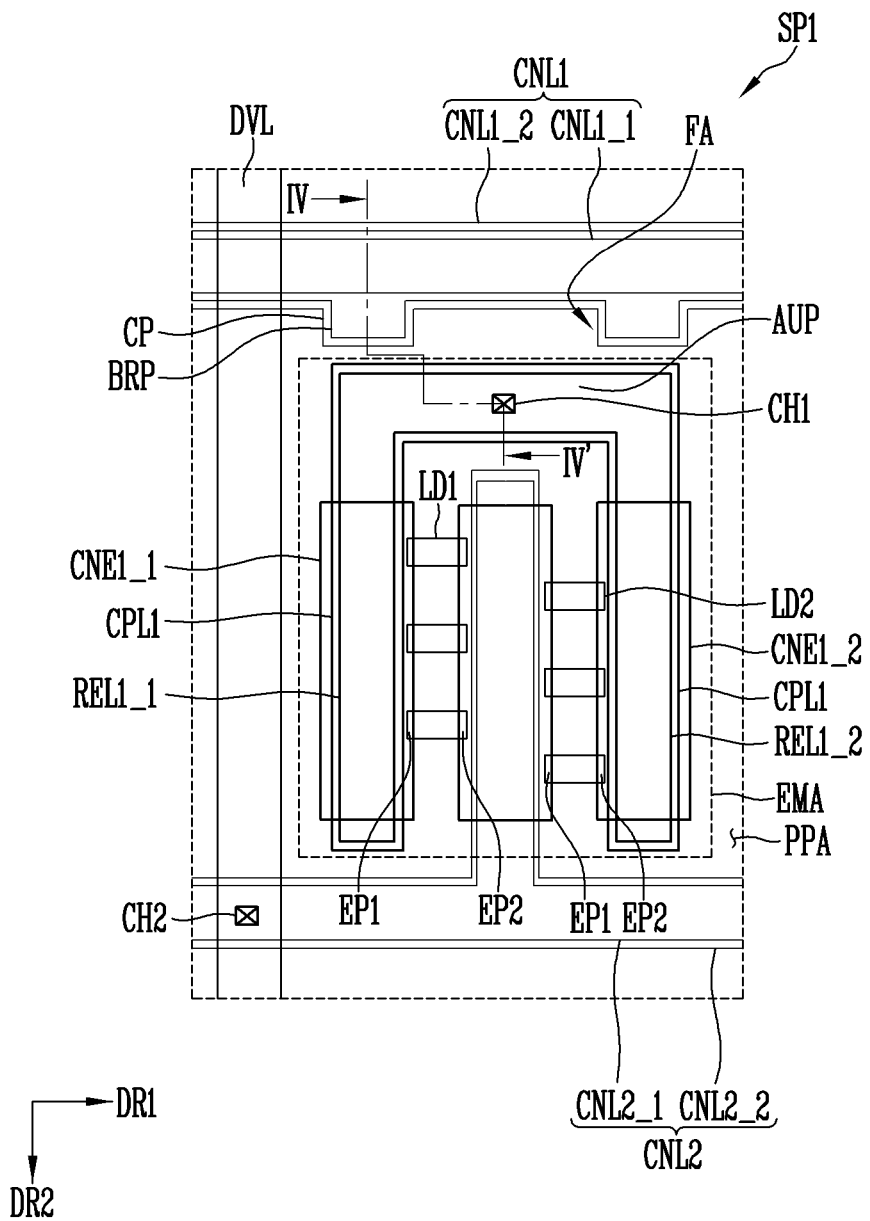
FIG. 11 is a schematic plan view illustrating another embodiment of the first sub-pixel of FIG. 9A.
Figure 12:
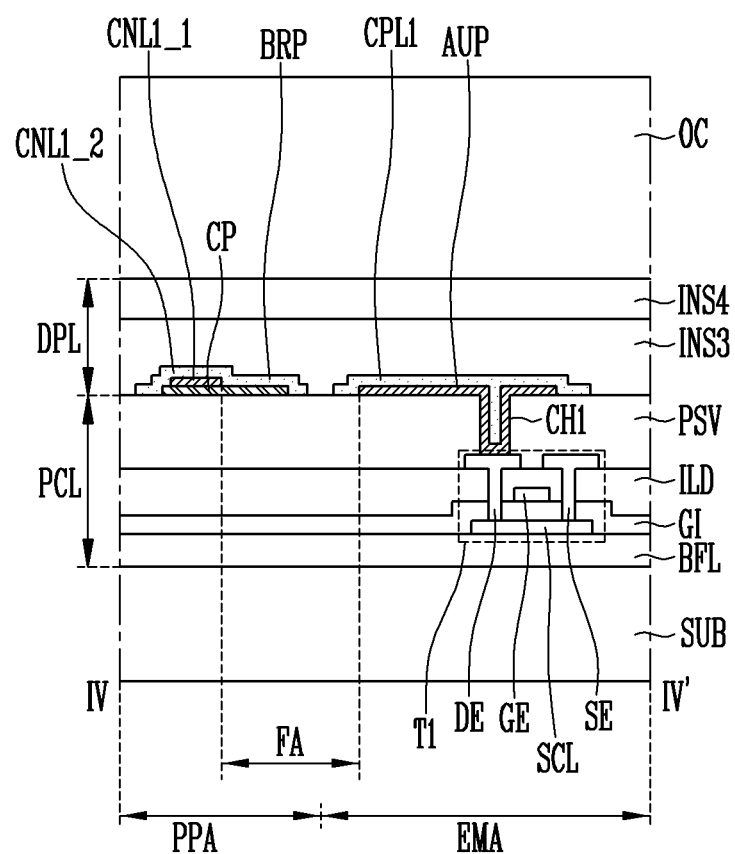
FIG. 12 is a schematic cross-sectional view taken along line IV-IV' of FIG. 11.

FIG. 11 is a schematic plan view illustrating another embodiment of the first sub-pixel of FIG. 9A. FIG. 12 is a schematic cross-sectional view taken along line IV-IV' of FIG. 11.

The first sub-pixel illustrated in FIG. 11, other than the fact that a conductive pattern is disposed under a 1-2-th connection line and a bridge pattern, may have a configuration substantially identical or similar to that of the first sub-pixel of FIG. 9A.

Therefore, to avoid redundant explanation, the description of the first sub-pixel of FIGS. 11 and 12 will be focused on differences from the foregoing embodiments. Components which are not separately explained in the following description of the embodiment comply with that of the foregoing embodiments. The same reference numeral will be used to designate the same component, and a similar reference numeral will be used to designate a similar component.

In FIG. 11, for the sake of explanation, light emitting elements provided in the first sub-pixel are illustrated as being horizontally arranged. However, the arrangement of the light emitting elements is not limited thereto. For example, at least some of the light emitting elements may be arranged in a direction intersecting the horizontal direction.

For the sake of explanation, illustration of transistors electrically connected to the light emitting elements, and signal lines electrically connected to the transistors has been omitted in FIG. 11.

Moreover, although FIGS. 11 and 12 illustrate a simplified structure of the first sub-pixel, e.g., showing that each electrode has only a single electrode layer, the disclosure is not limited thereto.

Referring to FIGS. 1A, 9A, 11, and 12, the first sub-pixel SP1 may include a substrate SUB, a pixel circuit layer PCL provided on the substrate SUB, and a display element layer DPL provided on the pixel circuit layer PCL.

In an embodiment of the disclosure, the first sub-pixel SP1 may include an emission area EMA configured to emit light, and a peripheral area PPA provided around the emission area EMA. The emission area EMA may include a pixel area of the first sub-pixel SP1. The peripheral area PPA may be a non-emission area which encloses at least one side of the emission area EMA and does not emit the light.

First and second connection lines CNL1 and CNL2 provided in the display element layer DPL may be provided in the peripheral area PPA of the first sub-pixel SP1. The first connection line CNL1 may include a 1-1-th connection line CNL1_1, and a 1-2-th connection line CNL1_2 provided on the 1-1-th connection line CNL1_1.

The first sub-pixel SP1 may include a first area FA disposed between the emission area EMA and the peripheral area PPA. In a plan and/or sectional view, the first area FA may refer to an area by which the first electrode REL1 and the 1-1-th connection line CNL1_1 that are provided in the display element layer DPL are spaced apart from each other. A bridge pattern BRP may be provided in the first area FA.

The bridge pattern BRP may be integral with the 1-2-th connection line CNL1_2 and may be electrically and/or physically connected to the 1-2-th connection line CNL1_2.

A conductive pattern CP may be further formed and/or provided in the peripheral area PPA of the first sub-pixel SP1. The conductive pattern CP may be provided between the substrate SUB and the 1-1-th connection line CNL1_1 in the peripheral area PPA and between the substrate SUB and the bridge pattern BRP in the first area FA.

The conductive pattern CP may be spaced apart from the first electrode REL1 and may be electrically and/or physically separated from the first electrode REL1 The conductive pattern CP may also be spaced apart from the second electrode REL2 of the display element layer DPL and may be electrically and/or physically separated from the second electrode REL2.

In a plan and sectional view, the conductive pattern CP may overlap each of the first connection line CNL1 and the bridge pattern BRP.

In the first area FA, a bridge pattern BRP may be provided on the conductive pattern CP. In the other area (hereinafter, referred to as "second area"') of the peripheral area PPA except the first area FA, the 1-1-th connection line CNL1_1 may be provided on the conductive pattern CP, and the 1-2-th connection line may be provided on the 1-1-th connection line CNL1_1.

Hence, the bridge pattern BRP and the conductive pattern CP may form a double-layer structure for low resistance in the first area FA. The 1-2-th connection line CNL1_2 and the conductive pattern CP may form a double-layer structure for low resistance in the second area.

While various embodiments have been described above, those skilled in the art will appreciate that various modifications, additions and substitutions are possible, without departing from the scope and spirit of the disclosure.

Therefore, the embodiments disclosed in this specification are only for illustrative purposes rather than limiting the technical spirit of the disclosure. The scope of the claimed invention shall be defined by the accompanying claims.

What is claimed is:

1. A display device comprising:
   a substrate including a display area and a non-display area; and
   a plurality of pixels provided in the display area of the substrate, each of the plurality pixels comprising a plurality of sub-pixels, wherein
   each of the plurality of sub-pixels comprises,
   a pixel circuit layer including at least one transistor; and
   a display element layer including:
      an emission area through which light is emitted;
      a peripheral area provided around the emission area;
      a first electrode provided in the emission area;
      a second electrode spaced apart from the first electrode;
      at least one light emitting element provided in the emission area and including:
         a first end electrically connected to the first electrode; and
         a second end electrically connected to the second electrode;
      a first connection line provided in the peripheral area, and extending in a direction; and
      a bridge pattern provided in the peripheral area, and diverging from the first connection line in another direction intersecting the direction, and
      the bridge pattern is electrically disconnected from each of the first and the second electrodes.

2. The display device according to claim 1, wherein the first connection line comprises:
   a 1-1-th connection line, the 1-1-th connection line and the first electrode being disposed on a same layer; and
   a 1-2-th connection line disposed on the 1-1-th connection line, and
   the bridge pattern is integral with the 1-2-th connection line.

3. The display device according to claim 2, wherein, in a plan view, the bridge pattern has a shape protruding from the 1-2-th connection line toward the emission area.

4. The display device according to claim 3, wherein the display element layer further comprises:
   a first capping layer disposed on the first electrode and overlapping the first electrode; and
   a second capping layer disposed on the second electrode and overlapping the second electrode, and
   the first capping layer and the 1-2-th connection line are disposed on a same layer.

5. The display device according to claim 4, wherein the bridge pattern is spaced apart from the first capping layer.

6. The display device according to claim 4, wherein
   the display element layer further includes a second connection line extending parallel to an extension direction of the first connection line in the peripheral area and electrically connected with the second electrode, and
   the second connection line comprises:
   a 2-1-th connection line, the 2-1-th connection line and the 1-1-th connection line being disposed on a same layer; and
   a 2-2-th connection line disposed on the 2-1-th connection line.

7. The display device according to claim 6, wherein the bridge pattern, the first and the second capping layers, the 1-2-th connection line, and the 2-2-th connection line are disposed on a same layer and include an identical material.

8. The display device according to claim 4, wherein the pixel circuit layer comprises:
   a driving voltage line disposed on the substrate and transmitting a driving voltage; and
   a passivation layer disposed on the at least one transistor and the driving voltage line, and including:
      a first contact hole exposing a portion of the at least one transistor; and
      a second contact hole exposing a portion of the driving voltage line, and
   the first contact hole is provided in the emission area such that the first contact hole corresponds to a portion of the first electrode.

9. The display device according to claim 8, wherein the first electrode is electrically connected to the at least one transistor through the first contact hole, and the second electrode is electrically connected to the driving voltage line through the second contact hole.

10. The display device according to claim 8, wherein
    the first electrode comprises a 1-1-th electrode and a 1-2-th electrode spaced apart from each other, the second electrode being disposed between the 1-1-th electrode and the 1-2-th electrode, and
    each of the 1-1-th electrode and the 1-2-th electrode is electrically connected to a same transistor of the at least one transistor.

11. The display device according to claim 10, wherein
    the display element layer further comprises an auxiliary pattern provided in the emission area and electrically connecting one end of the 1-1-th electrode with one end of the 1-2-th electrode, and
    the auxiliary pattern is integral with the 1-1-th and the 1-2-th electrodes.

12. The display device according to claim 11, wherein at least one of the first and second contact holes is provided in the emission area such that at least one of the first and second contact holes corresponds to a portion of the auxiliary pattern.

13. The display device according to claim 12, wherein the display element layer further comprises a conductive pattern disposed between the passivation layer and the bridge pattern in the peripheral area.

14. The display device according to claim 13, wherein the conductive pattern overlaps the bridge pattern in a plan view, and is electrically disconnected from each of the first and the second electrodes.

15. The display device according to claim 8, wherein the display element layer further comprises:
    a first contact electrode disposed on the first electrode, and electrically connecting the first electrode with the first end of the at least one light emitting element; and
    a second contact electrode disposed on the second electrode, and electrically connecting the second electrode with the second end of the light emitting element.

16. The display device according to claim 15, wherein the at least one light emitting element comprises a light emitting diode having a shape of a cylinder or polyprism having a microscale or nanoscale size.

17. A method of fabricating a display device, comprising:
    forming a pixel circuit layer including at least one transistor on a substrate; and forming, on the pixel circuit layer, a display element layer including a plurality of emission areas that emit light, and a peripheral area provided around each of the plurafity of emission areas,
wherein the forming of the display element layer comprises:
  forming a first electrode and a second electrode spaced apart from each other in each of the plurality of emission areas,
  forming, in the peripheral area, a 1-1-th connection line extending in a direction and a 2-1-th connection line provided parallel to the direction in which the 1-1-th connection line extends;
  forming a metal layer on the first and the second electrodes and the 1-1-th connection line;
  forming, on the 2-1-th connection line, a 2-2-th connection line including a material identical to a material of the metal layer;
  aligning a plurality of light emitting elements between the first and the second electrodes by applying an electric field between the first and the second electrodes; and
  forming, by removing a portion of the metal layer, on the substrate including the plurality of light emitting elements, a capping layer overlapping each of the first and the second electrodes, a 1-2-th connection line overlapping the 1-1-th connection line, and a bridge pattern electrically disconnected from the capping layer, and
  forming the 1-2-th connection line and the bridge pattern to be in the peripheral area and electrically disconnected from each of the first and the second electrodes.

18. The method according to claim 17, wherein the forming of the 1-2-th connection line and the bridge pattern comprises forming the 1-2-th connection line and the bridge pattern to be integral with each other.

19. The method according to claim 18, wherein
the forming of the pixel circuit layer comprises forming a passivation layer including a contact hole that exposes a portion of the at least one transistor; and
is provided in each of the plurality of emission areas such that the contact hole corresponds to a portion of the first electrode.

20. The method according to claim 19, further comprising:
forming, on the first electrode, a first contact electrode electrically connecting the first electrode with one end of opposite ends of each of the plurality of light emitting elements; and
forming, on the second electrode, a second contact electrode electrically connecting the second electrode with another end of the opposite ends of each of the plurality of light emitting elements.

* * * * *